(12) United States Patent
Jiang et al.

(10) Patent No.: US 10,886,222 B2
(45) Date of Patent: Jan. 5, 2021

(54) VIA CONTACT, MEMORY DEVICE, AND METHOD OF FORMING SEMICONDUCTOR STRUCTURE

(71) Applicant: MACRONIX INTERNATIONAL CO., LTD., Hsinchu (TW)

(72) Inventors: Yu-Wei Jiang, Hsinchu (TW); Kuo-Pin Chang, Zhubei (TW); Chih-Wei Hu, Toufen (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/380,040

(22) Filed: Apr. 10, 2019

(65) Prior Publication Data

US 2020/0328154 A1 Oct. 15, 2020

(51) Int. Cl.
*H01L 21/768* (2006.01)
*H01L 23/528* (2006.01)
*H01L 27/11568* (2017.01)
*H01L 21/311* (2006.01)
*H01L 23/522* (2006.01)
*H01L 27/11573* (2017.01)
(Continued)

(52) U.S. Cl.
CPC .... *H01L 23/5283* (2013.01); *H01L 21/31111* (2013.01); *H01L 21/76831* (2013.01); *H01L 21/76843* (2013.01); *H01L 21/76877* (2013.01); *H01L 21/76897* (2013.01); *H01L 23/5226* (2013.01); *H01L 27/11568* (2013.01); *H01L 27/11573* (2013.01); *H01L 27/11582* (2013.01); *H01L 29/40117* (2019.08); *H01L 21/0214* (2013.01); *H01L 21/0217* (2013.01); *H01L 21/02164* (2013.01); *H01L 21/31053* (2013.01); *H01L 21/3212* (2013.01); *H01L 21/7684* (2013.01)

(58) Field of Classification Search
CPC ......... H01L 27/11568; H01L 27/11582; H01L 21/76831; H01L 23/5226; H01L 21/76843; H01L 21/31053
See application file for complete search history.

(56) References Cited

U.S. PATENT DOCUMENTS 9,666,281 B2 * 5/2017 Sakakibara ........ G11C 16/0483
2010/0013049 A1 * 1/2010 Tanaka .............. H01L 27/11575
257/532
(Continued)

*Primary Examiner* — Laura M Menz
*Assistant Examiner* — Khatib A Rahman
(74) *Attorney, Agent, or Firm* — McClure, Qualey & Rodack, LLP

(57) ABSTRACT

Disclosed herein is a method of forming a semiconductor structure. The method includes the steps of: forming a first dielectric layer having a first through hole on a precursor substrate, in which the first through hole passes through the first dielectric layer; filling a sacrificial material in the first through hole; forming a second dielectric layer having a second through hole over the first dielectric layer, in which the second through hole exposes the sacrificial material in the first through hole, and the second through hole has a bottom width less than a top width of the first through hole; removing the sacrificial material after forming the second dielectric layer having the second through hole; forming a barrier layer lining sidewalls of the first and second through holes; and forming a conductive material in the first and second through holes.

11 Claims, 25 Drawing Sheets

(51) Int. Cl.
    *H01L 27/11582*     (2017.01)
    *H01L 21/28*     (2006.01)
    *H01L 21/3105*     (2006.01)
    *H01L 21/02*     (2006.01)
    *H01L 21/321*     (2006.01)

(56) References Cited

U.S. PATENT DOCUMENTS

| | | |
|---|---|---|
| 2014/0021632 A1 | 1/2014 | Lee et al. |
| 2014/0217559 A1* | 8/2014 | Choi ................ H01L 23/53295 |
| | | 257/621 |
| 2017/0221756 A1 | 8/2017 | Tsutsumi et al. |

\* cited by examiner

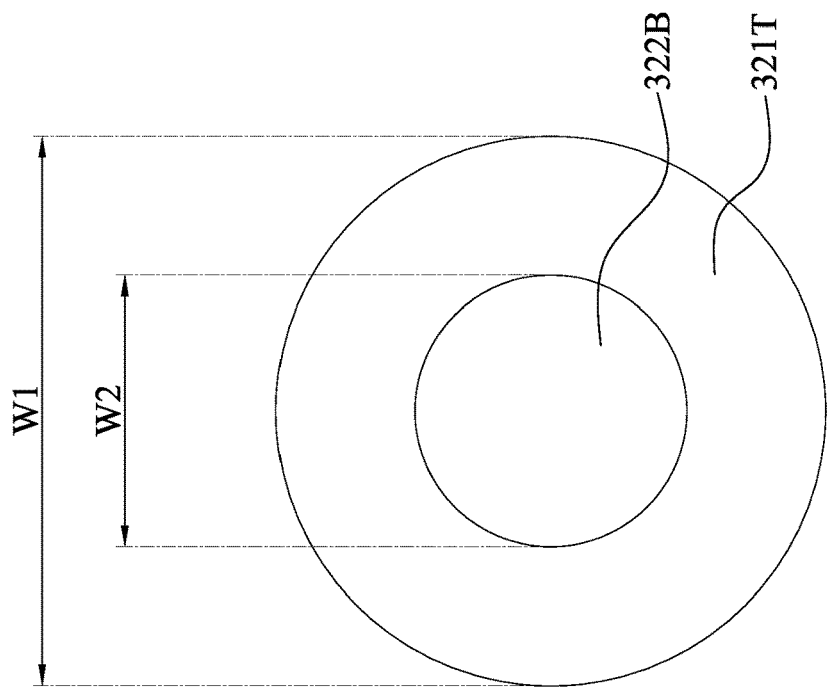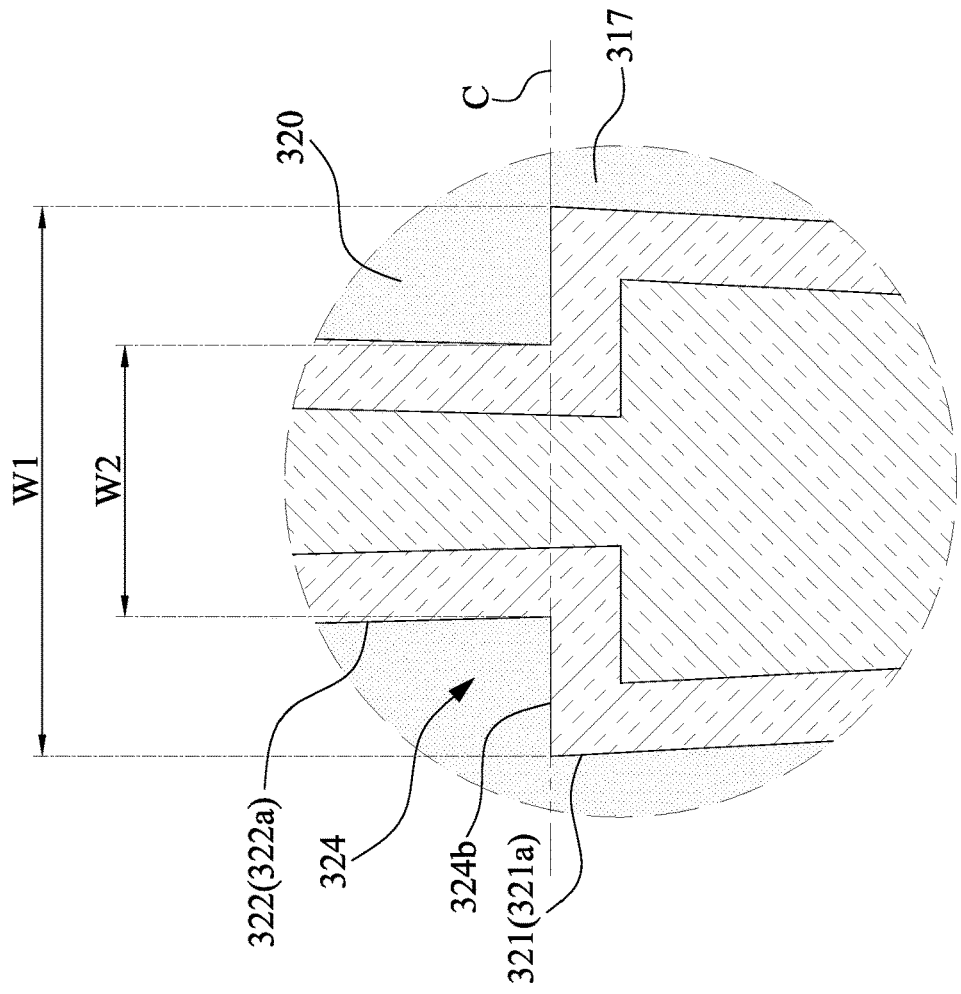

VIA CONTACT, MEMORY DEVICE, AND METHOD OF FORMING SEMICONDUCTOR STRUCTURE

BACKGROUND

Technical Field

The present disclosure relates to a semiconductor structure and a method for manufacturing the same. More particularly, the present disclosure relates to a via contact for a semiconductor device, a memory device with the via contact, and methods for manufacturing the via contact and the memory device.

Description of Related Art

The semiconductor integrated circuit (IC) industry has experienced rapid growth. Technological progress in IC manufacture has produced several generations of ICs, and each generation fabricates smaller and more complex circuits than the previous generation. Several advanced techniques have been developed to implement smaller feature sizes, and these techniques are employed in the manufacturing of the storage devices such as flash memory devices. However, some processes have not been entirely satisfactory in all respects. For example, the formation of a via contact with a high aspect ratio is a challenge in conventional etching approaches. Accordingly, one of the aspects of the present disclosure is to provide a solution to form a contact via with a high aspect ratio.

SUMMARY

On aspect of the present disclosure is to provide a method of forming a semiconductor structure. The method includes the steps of: forming a first dielectric layer having a first through hole on a precursor substrate, in which the first through hole passes through the first dielectric layer; filling a sacrificial material in the first through hole; forming a second dielectric layer having a second through hole over the first dielectric layer, in which the second through hole exposes the sacrificial material in the first through hole, and the second through hole has a bottom width less than a top width of the first through hole, and the first through hole is at least partially overlapped with the second through hole in a direction perpendicular to the precursor substrate; removing the sacrificial material after forming the second dielectric layer having the second through hole; forming a barrier layer lining sidewalls of the first and second through holes; and forming a conductive material in the first and second through holes.

Another aspect of the present disclosure is to provide a via contact for a semiconductor device. The via contact includes a first conductive structure, a second conductive structure and a barrier layer. The first conductive structure has a top. The second conductive structure includes a bottom disposed over and in contact with the top of the first conductive structure. The bottom of the second conductive structure has a width that is less than a width of the top of the first conductive structure such that a portion of the top is unoccupied by the bottom of the second conductive structure. The barrier layer wraps the sidewalls of the first and second conductive structures and is continuous from the sidewall of the first conductive structure through the unoccupied portion of the top to the sidewall of the second conductive structure.

Another aspect of the present disclosure is to provide a memory device, which includes a semiconductor substrate, a dielectric layer, a barrier layer and a conductive plug. The semiconductor substrate includes a memory array region and a peripheral circuit adjacent to the memory array region. The dielectric layer is disposed over the peripheral circuit and has a first via and a second via. The second via is above and connected with the first via. The second via has a bottom area that is less than a top area of the first via so that the dielectric layer has an overhang at a junction of the first via and the second via. The barrier layer is continuously extended from a sidewall of the first via through the overhang to a sidewall of the second via. The conductive plug is filled in the first and second vias.

It is to be understood that both the foregoing general description and the following detailed description are by examples, and are intended to provide further explanation of the present disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16A is an enlarge view illustrating the region R of the FIG. 15.

FIG. 16B is a plan view illustrating the first via and the second via along a cutting plan C in region R.

DESCRIPTION OF THE EMBODIMENTS

Figure 1:
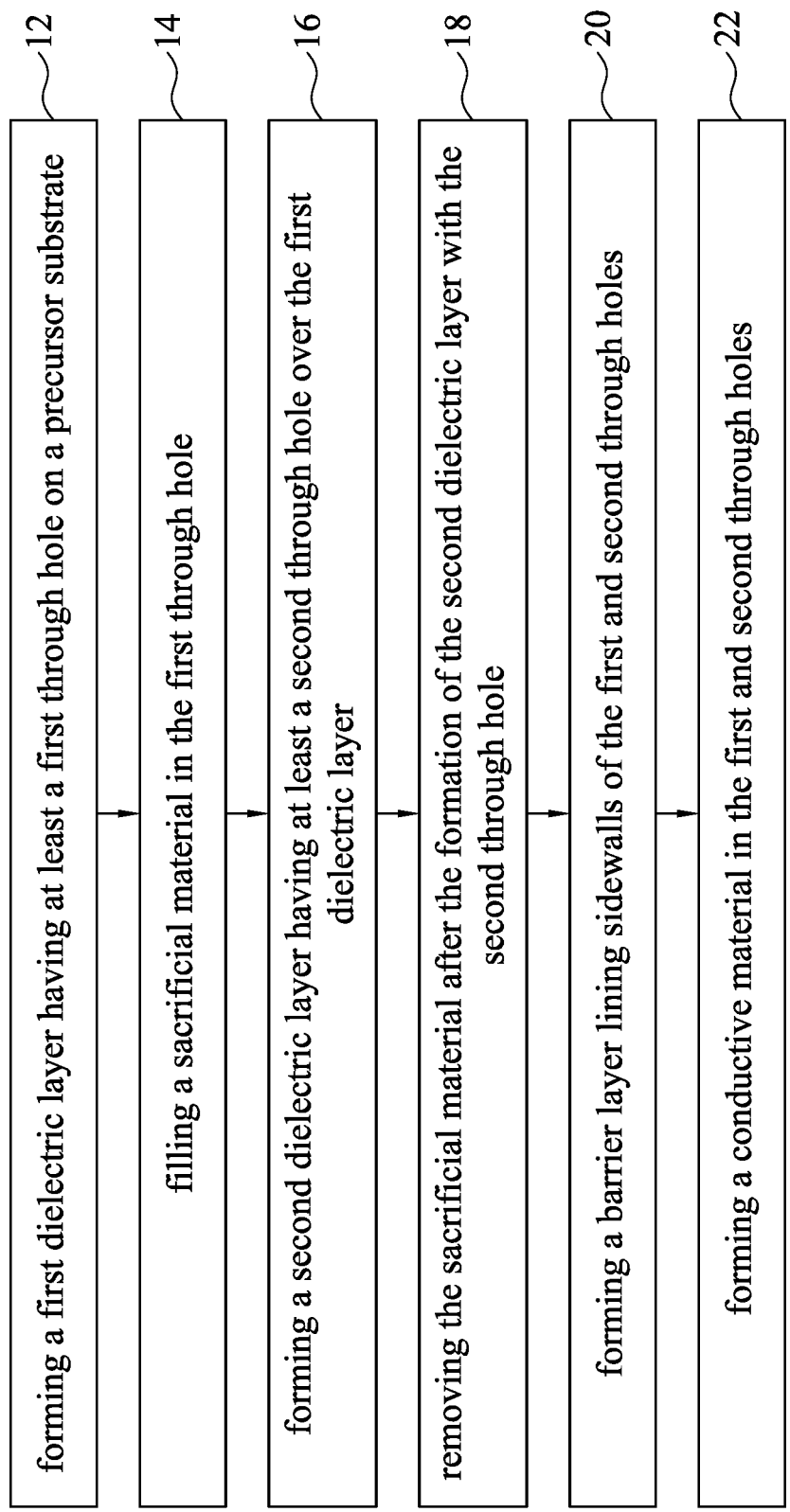
FIG. 1 is a flow chart illustrating a method of forming a semiconductor structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or step in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−20% of the number described or other values as understood by person skilled in the art. For example, the term "about 5 nm" encompasses the dimension range from 4.0 nm to 6.0 nm.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a flow chart illustrating a method 10 of forming a semiconductor structure according to various embodiments of the present disclosure. The method 10 includes steps 12, 14, 16, 18, 20, and 22. FIGS. 2-13 collectively illustrate more detailed manufacturing methods as a series of cross-sectional views in accordance with various embodiments of the present disclosure. It will be appreciated that although these methods each illustrate a number of steps and/or features, not all of these steps and/or features are necessarily required, and other un-illustrated steps, steps and/or features may also be present. Also, the ordering of the steps in some embodiments can vary from what is illustrated in these figures. In addition, the illustrated steps can be further divided into sub-steps in some implementations, while in other implementations some of the illustrated steps can be carried out concurrently with one another.

Figure 2:
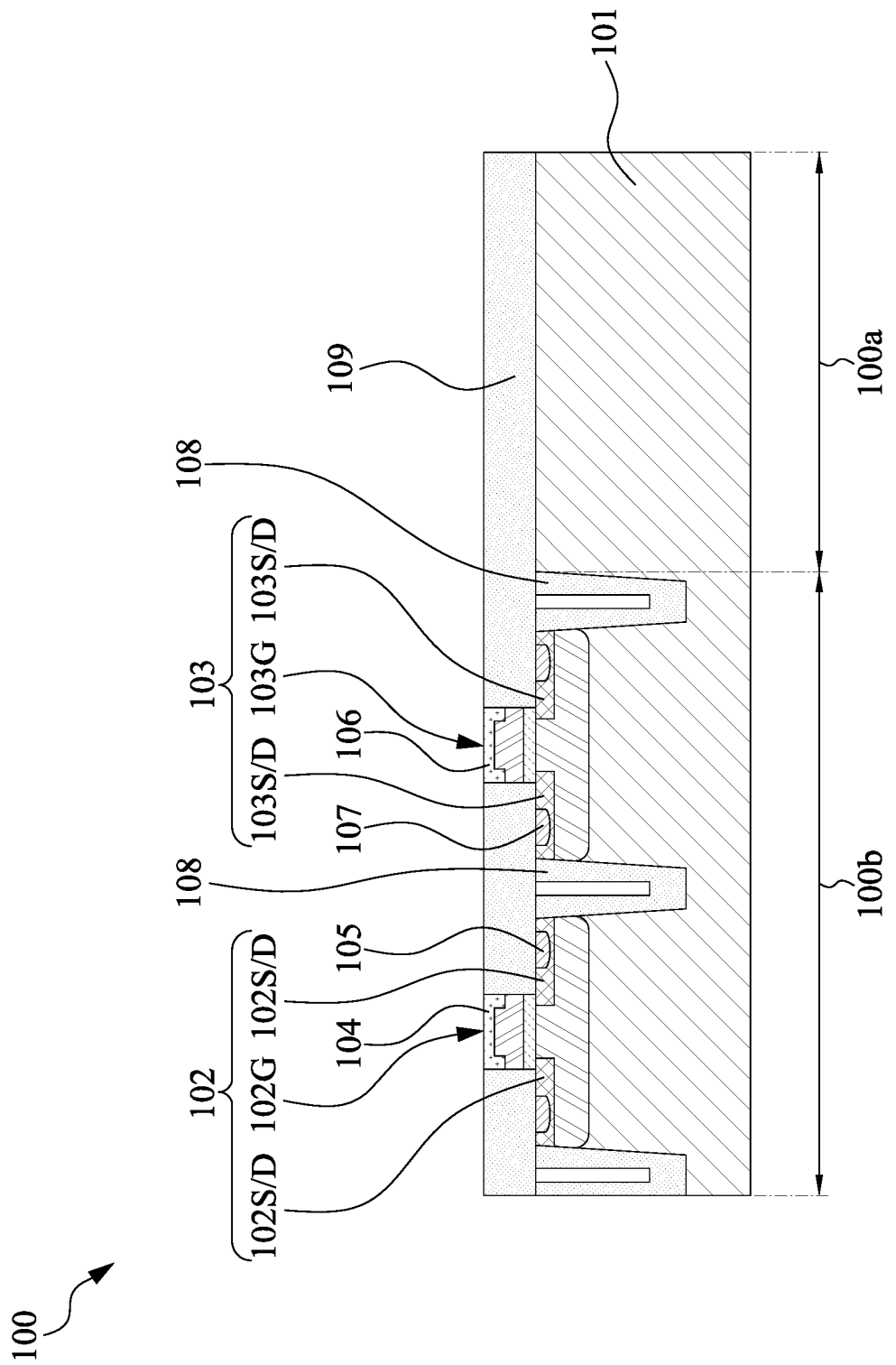
FIGS. 2-13 are cross-sectional views schematically illustrating methods of forming a semiconductor structure according to some embodiments of the present disclosure.

Referring to FIG. 1, the method 10 includes the step 12 of forming a first dielectric layer having at least a first through hole on a precursor substrate. As illustrated in FIG. 2, a precursor substrate 100 is provided prior to the formation of the first dielectric layer. In some embodiments, the precursor substrate 100 includes a semiconductor substrate 101 having a memory array region 100a and a peripheral circuit region 100b adjacent to memory array region 100a. The semiconductor substrate 101, for example, may include silicon. In some embodiments, the semiconductor substrate 101 may include other elementary semiconductor such as for example germanium. In yet some embodiments, the semiconductor substrate 101 may include an alloy semiconductor such as for example silicon germanium, silicon germanium carbide, gallium indium phosphide and the like. In yet some embodiments, the semiconductor substrate 101 may include compound semiconductor such as for example gallium arsenic, silicon carbide, indium phosphide, indium arsenide and the like. In yet some embodiments, the semiconductor substrate 101 may include a semiconductor-on-insulator (SOI) structure. In yet some embodiments, the semiconductor substrate 101 may include an epitaxial layer overlying a bulk semiconductor material.

According to some embodiments, the precursor substrate 100 further includes a peripheral circuits, such as a high voltage p-typed metal-oxide-semiconductor transistor (hereinafter referred to as "HV pMOS") 102 and a low voltage n-typed metal-oxide-semiconductor transistor (hereinafter referred to as "LV nMOS") 103, on the peripheral circuit region 100b. The HV pMOS 102 includes a gate 102G and source/drain regions 102S/D. The gate 102G may optionally have a silicide feature 104 formed thereon. The source/drain regions 102S/D may optionally have conductive features 105 (such as heavily doped regions or silicide features) thereon. Similarly, the LV nMOS 103 includes a gate 103G and source/drain regions 103S/D. The gate 103G may optionally have a silicide feature 106 thereon. The source/drain regions 103S/D may optionally have conductive features 107 (such as heavily doped regions or silicide features) thereon. On the memory array region 100a, data storage structures will be formed in subsequent processes, and that will be described in detail hereinafter. In yet some embodiments, the precursor substrate 100 may further include one or more isolation structures 108 such as shallow trench isolation in the semiconductor substrate 101. The isolation structure 108 is formed between the memory array region 100a and the peripheral circuit region 100b and separates the memory array region 100a from the peripheral circuit region 100b. In some examples, at least one of the isolation structures 108 is formed between the HV pMOS 102 and the LV nMOS 103 and separates the HV pMOS 102 from the LV nMOS 103. In yet some embodiments, the precursor substrate 100 may further include a dielectric layer 109 covering the memory array region 100a and the source/drain regions 102S/D and 103S/D on peripheral circuit region 100b, in which the gate 102G and the gate 103G are exposed out of the dielectric layer 109, but the present disclosure is not limited thereto.

Figure 3:
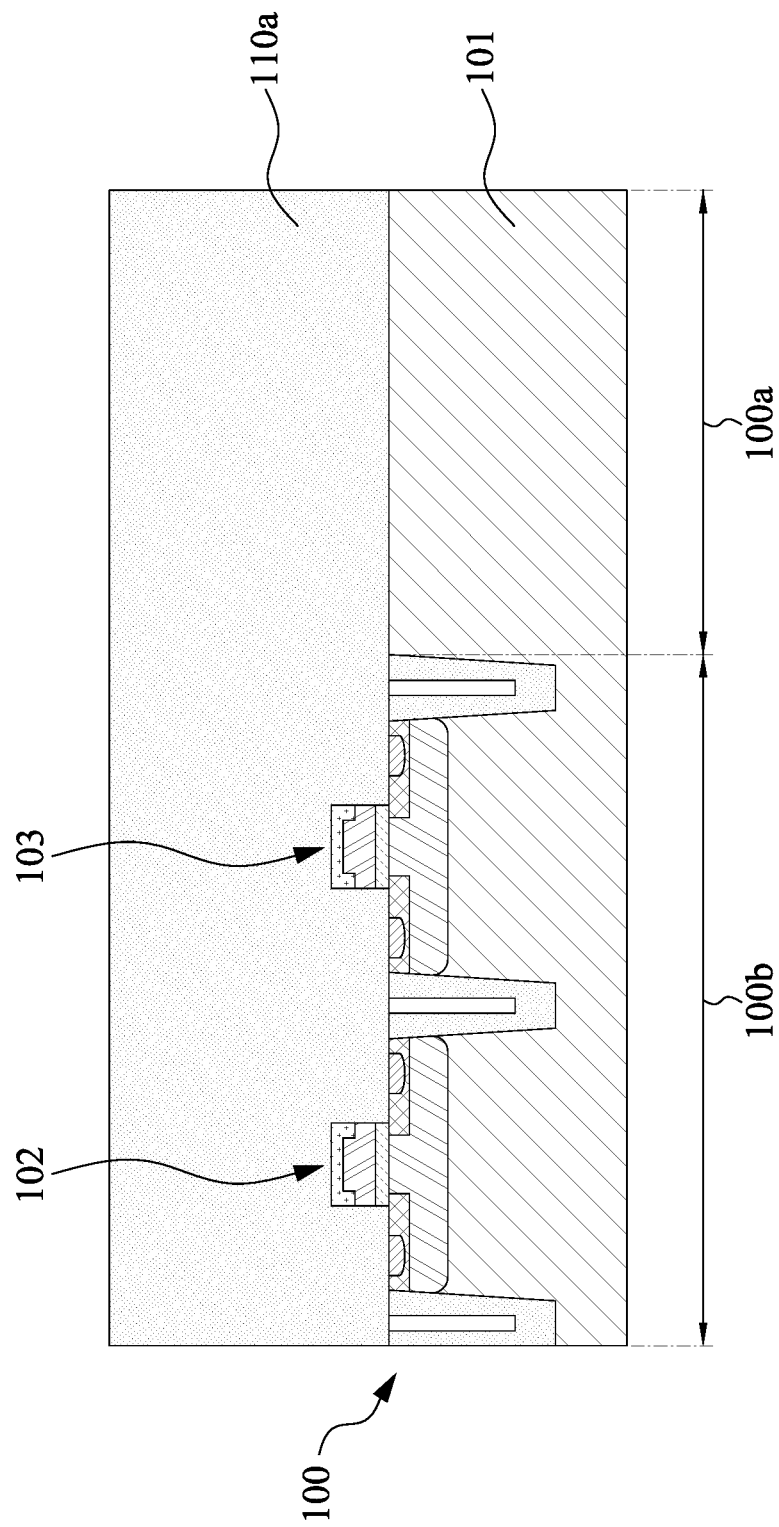
Figure 4:
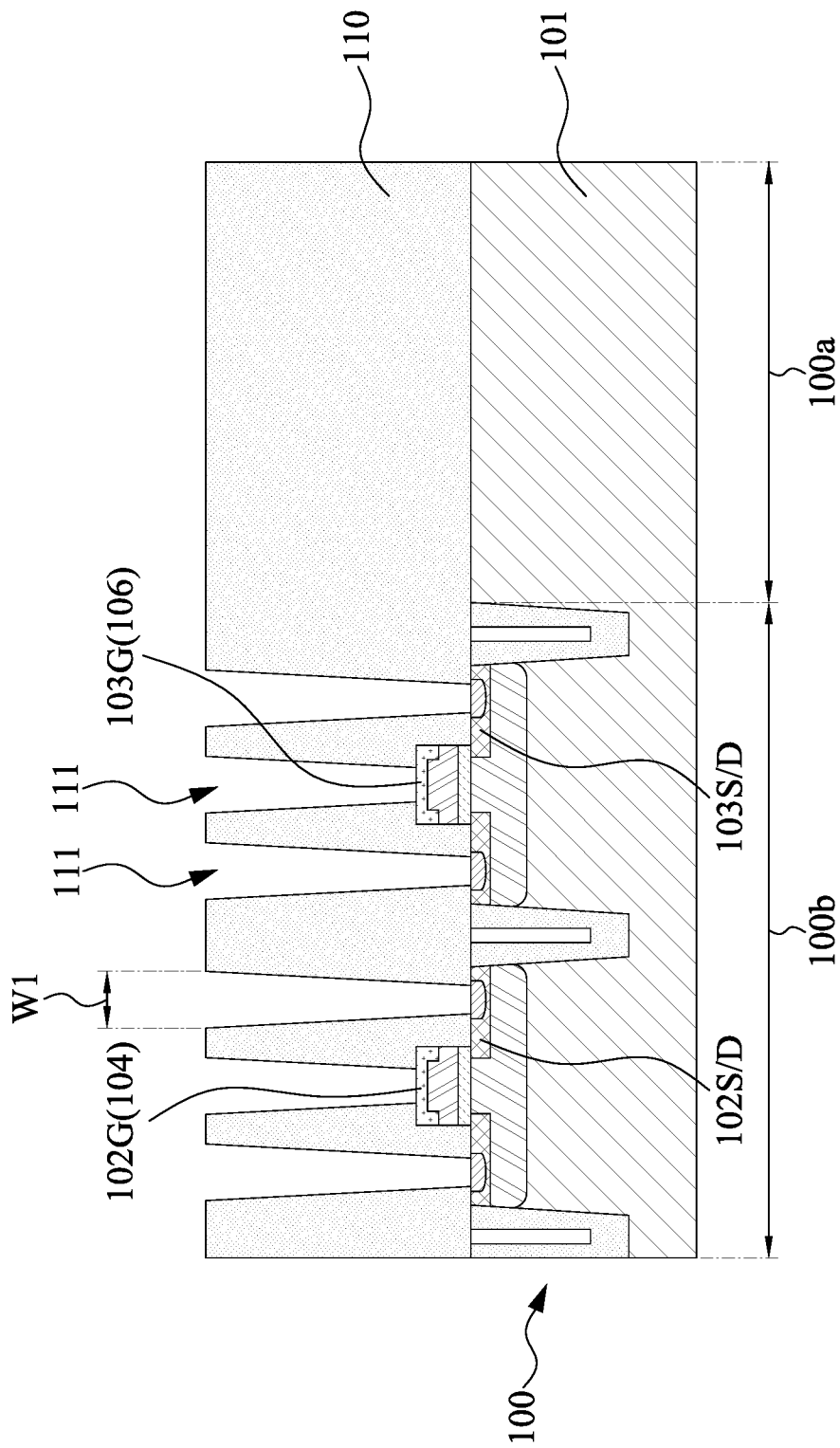

FIGS. 3 and 4 illustrating an approach of forming the first dielectric layer having the first through hole, as illustrated in the step 12, according to some embodiments. Referring to FIG. 3, a dielectric material layer 110a is formed on the precursor substrate 100 in a blanket manner. The dielectric material layer 110a overlays both the memory array region 100a and the peripheral circuit region 100b according to some examples. The dielectric material layer 110a may be formed by processes such as for example chemical vapor deposition (CVD) processes, high density plasma (HDP) CVD processes, sub-atmospheric pressure CVD (SACVD) processes, spin-on dielectric (SOD) processes, and other suitable deposition techniques. In examples, the dielectric material layer 110a may include material such as silicon oxide or suitable low dielectric constant (low k) materials. Illustrative examples of the low k materials include fluorinated silica glass (FSG), bis-benzocyclobuteues (BCB), carbon doped silicon oxide, amorphous fluorinated carbon, polyimide, and/or other materials.

Reference is made to FIG. 4. In some embodiments, the dielectric material layer 110a is selectively etched to form a first dielectric layer 110 having at least a first through hole 111 (i.e., one or more first through holes 111) on the precursor substrate 100, in which the first through hole 111 passes through the first dielectric layer 110. In some embodiments, the first through holes 111 are formed in the peripheral circuit region 100b, and the periphery circuit is exposed out though the first through holes 111. In examples, the first through holes 111 are aligned with the gate 102G and the gate 103G, thereby exposing the gates 102G and 103G. For instance, the silicide features 104, 106 of the gates 102G, 103G may be exposed out though the first through holes 111. In yet some examples, the first through holes 111 further expose the source/drain regions 102S/D and 103S/D. Although FIG. 4 illustrates a plurality of first through holes 111, the present disclosure is not limited to the plurality of the first through holes. For example, the present disclosure may be implemented by forming a single through hole 111. Furthermore, the present disclosure is not limited to the approach illustrated in FIGS. 3 and 4. The first dielectric layer 110 having the first through holes 111 may be formed by other suitable techniques.

Figure 5:
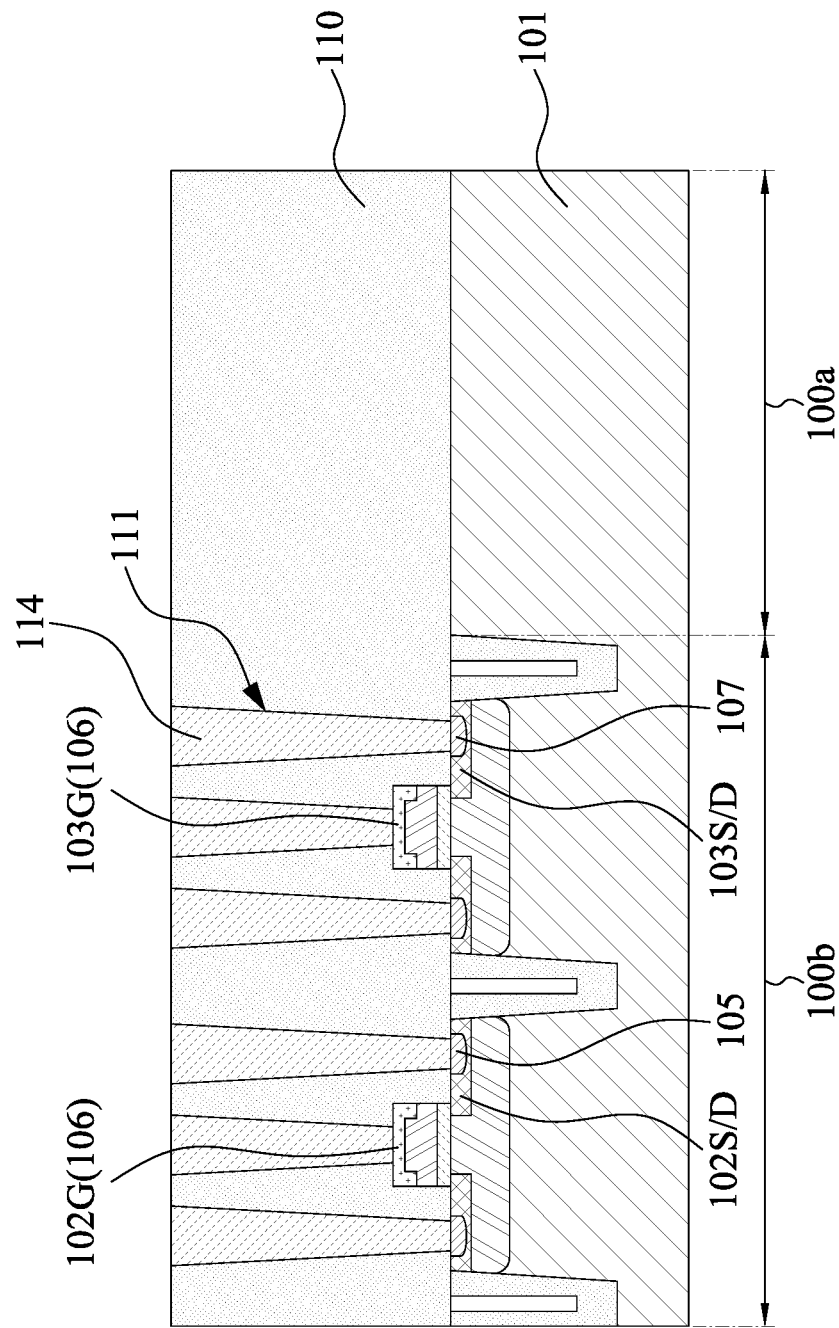

The method 10 proceeds to the step 14 of FIG. 1 by filling a sacrificial material in the first through hole. As illustrated in FIG. 5, the first through hole 111 is filled with a sacrificial material 114. In embodiments, a sacrificial material 114 may be deposited to fill the first through hole 111 and cover the first dielectric layer 110, and thereafter an etching back process or a chemical-mechanical polishing (CMP) process may be carried out to remove the extra material deposited over the first dielectric layer 110, thereby forming the sacrificial material 114 illustrated in FIG. 5. In some embodiments, the sacrificial material 114 filling the first through hole 111 is in contact with at least one of the gates 102G, 103G. For instance, the silicide feature 104 and/or silicide feature 106 of the gates 102G, 103G may contact the sacrificial material 114. In the embodiments where a number of first through holes 111 are formed, the sacrificial material 114 in the first through holes 111 further contact the conductive features 105, 107 of the source/drain regions 102S/D, 103S/D. In yet some embodiments, the sacrificial material 114 is made with dielectric material capable of suppressing or inhibiting the diffusion of silicide material. For examples, the sacrificial material 114 may be made of silicon nitride or the like. The term "made of" and "formed of" used in the present disclosure may mean either "comprising" or "consisting of." The sacrificial material 114 formed at this stage or step provides certain technical effects for the subsequent processes, which will be described hereinafter.

The method 10 proceeds to the step 16 of FIG. 1 by forming a second dielectric layer having at least a second through hole over the first dielectric layer. There are several approaches to implement the step 16, and the following descriptions in connection with FIGS. 6-11 are merely embodiments or examples, and the present disclosure is not limited thereto. Furthermore, other features and/or structures may be formed concurrently with the formation of the second dielectric layer having the second through hole(s).

Figure 6:
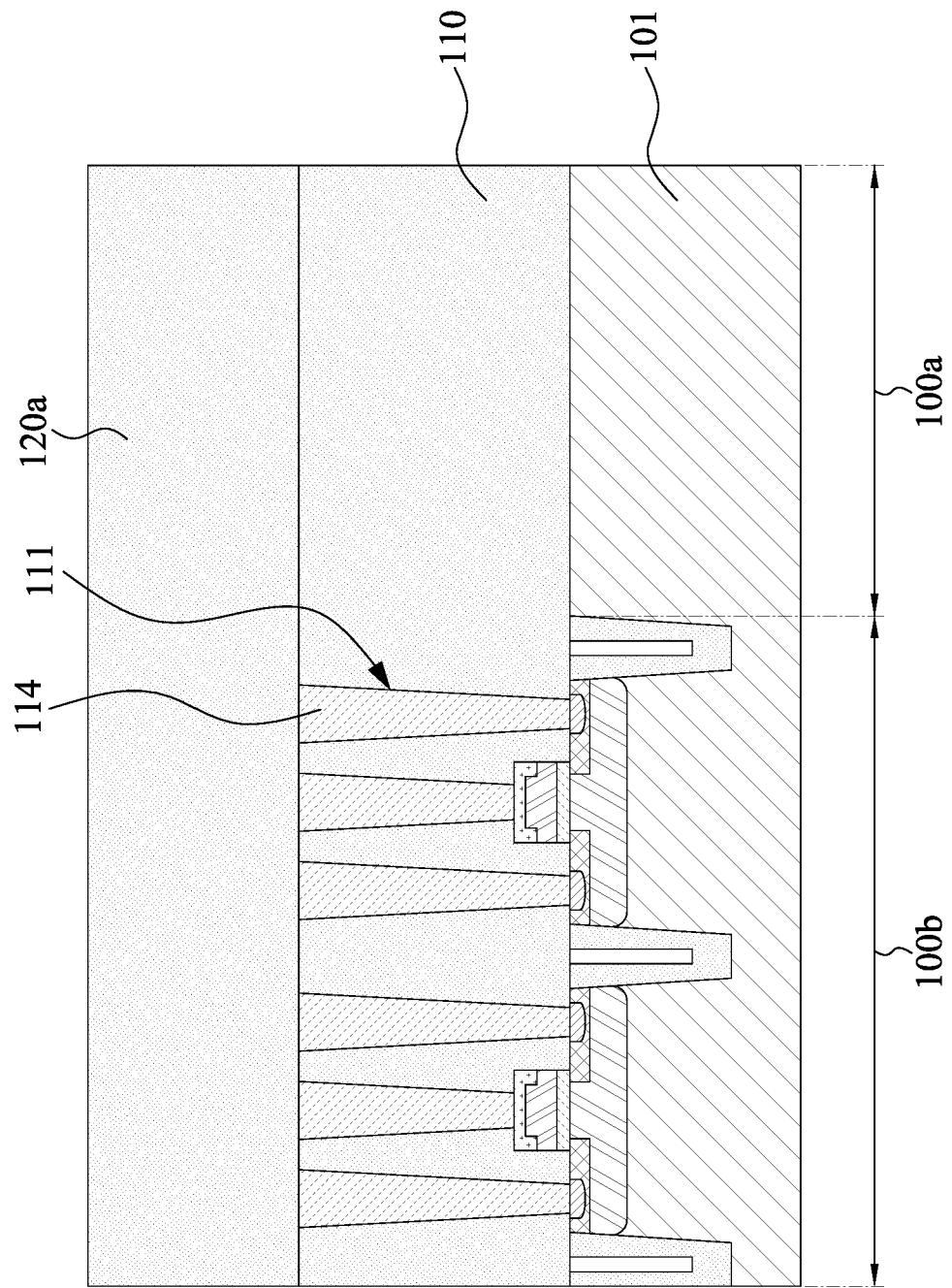
Figure 7:
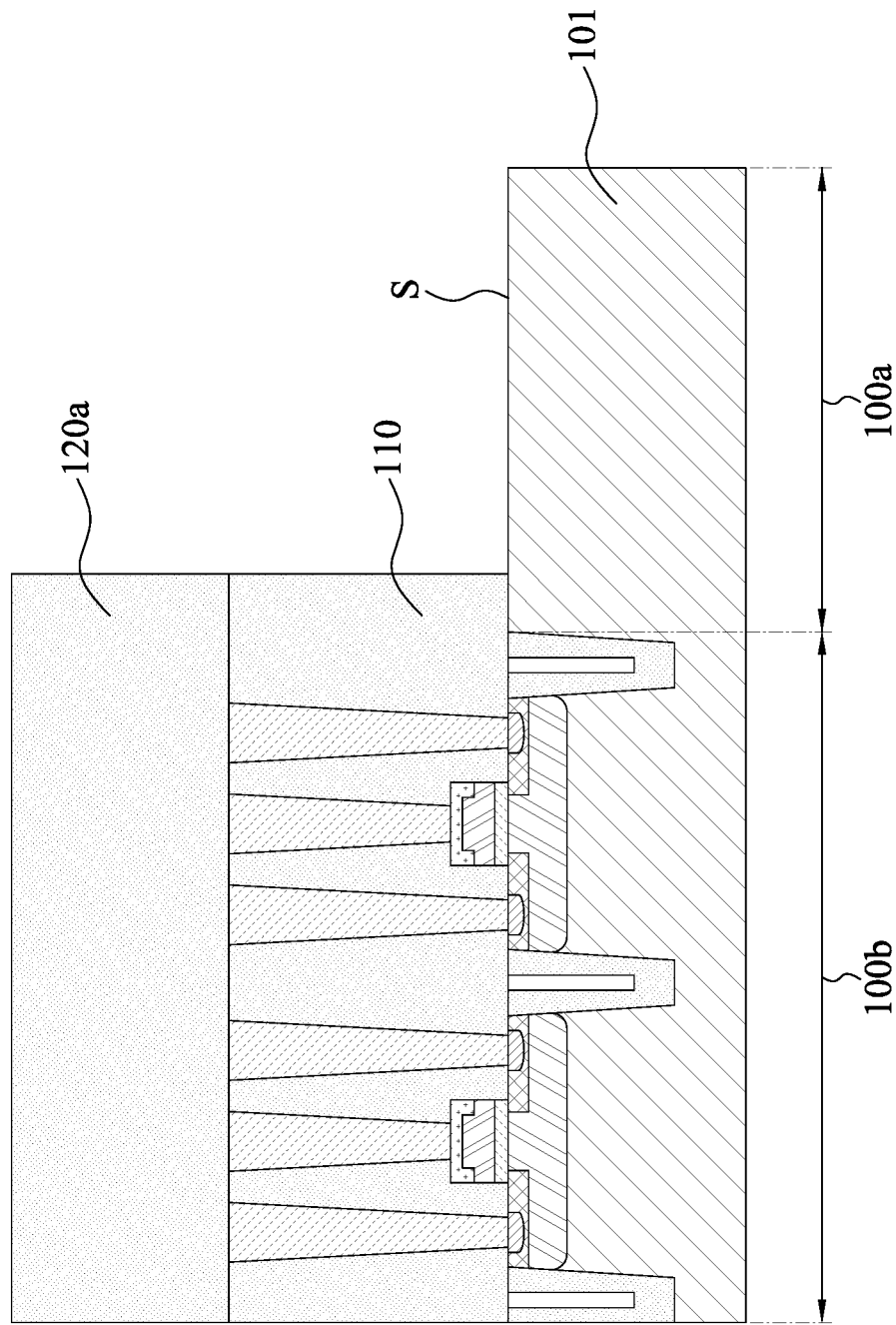

As illustrated in FIG. 6, according to some embodiments, a dielectric material layer 120a is formed over both the first dielectric layer 110 and the sacrificial material 114. In some embodiments, the dielectric material layer 120a further covers the first dielectric layer 110 on the memory array region 100a. In some examples, the dielectric material layer 120a seals the sacrificial material 114 in the first through hole(s) 111. In yet some embodiments, the dielectric material layer 120a is made of the same material as the first dielectric layer 110, but is different from the material of the sacrificial material 114. For example, the first dielectric layer 110 and the dielectric material layer 120a include oxide layers while the sacrificial material 114 includes silicon nitride. In yet some embodiments, the first dielectric layer 110 and the dielectric material layer 120a are made of different materials. For instance, one is made of silicon oxynitride, and another one is made of silicon oxide, while the sacrificial material 114 includes silicon nitride, but the present disclosure is not limited thereto. Reference is made to FIG. 7. In some embodiments, portions of the first dielectric layer 110 and the dielectric material layer 120a are removed to expose the memory array region 100a. For example, an etching process may be employed to remove the portions of the first dielectric layer 110 and the dielectric material layer 120a. Specifically, after the removal of the portions of the first dielectric layer 110 and the dielectric material layer 120a on the memory array region 100a, a principal surface S of the memory array region 100a on the semiconductor substrate 101 is exposed.

Figure 8:
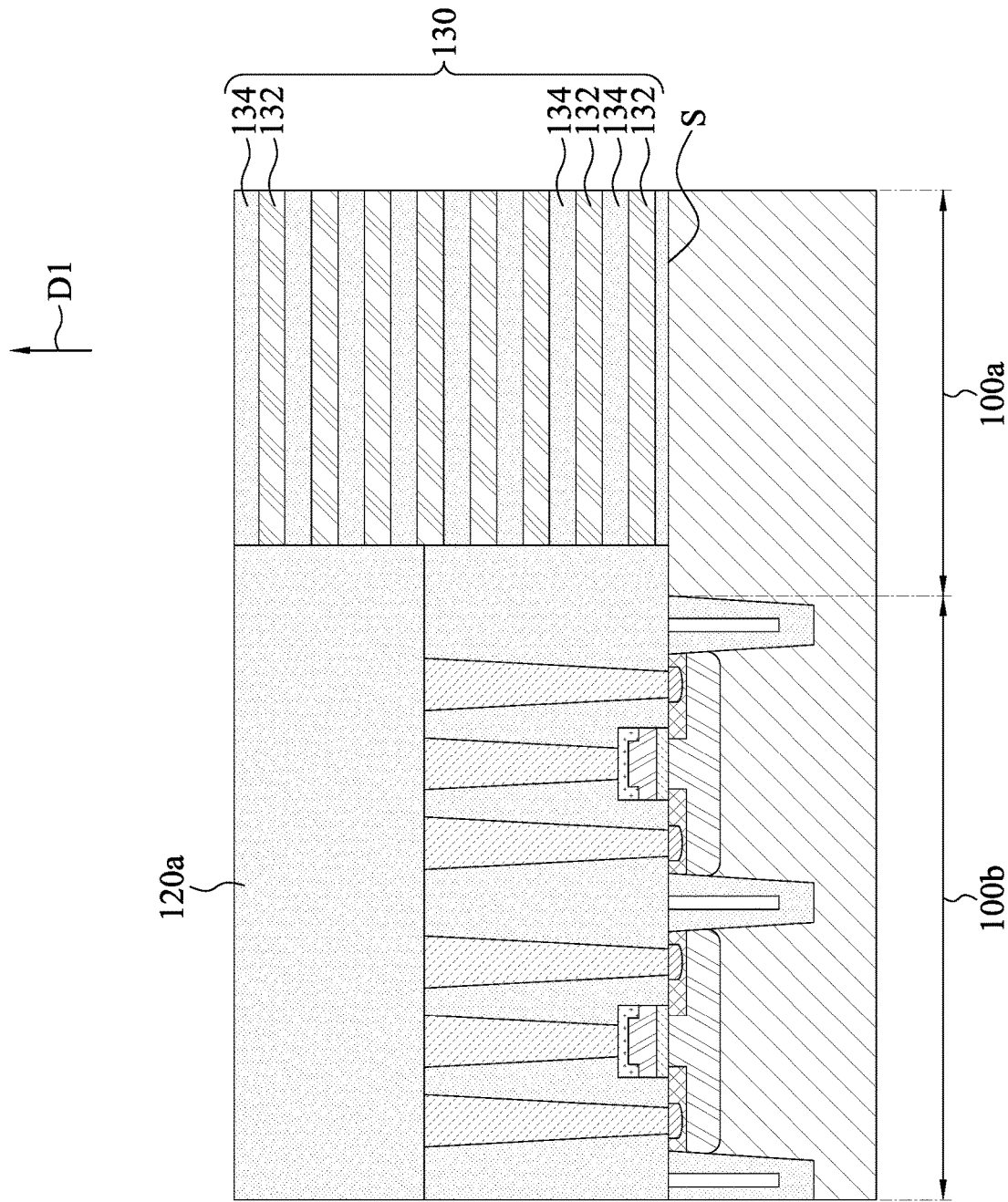

Reference is made to FIG. 8. In some embodiments, a stack 130 including a plurality of conductive layers 132 and a plurality of insulating layers 134 are formed on the memory array region 100a, in which the conductive layers 132 and the insulating layers 134 are alternately stacked. In some embodiments, the stack 130 may include several tens to hundreds of conductive layers 132 and insulating layers 134. The conductive layers 132 may be formed of any suitable conductive material, for example semiconductor material, metallic material, or other conductive material. The semiconductor material, for example, may be doped or undoped polysilicon. Illustrative examples of the metallic material includes titanium nitride, copper, tungsten and platinum. The present disclosure is not limited to the material described above, and one skilled in the art may select suitable material for the conductive layers 132 according to actual needs. The insulating layers 134 may be formed of any suitable dielectric material such as for example silicon oxide or low dielectric constant (low k) materials. Illustrative examples of the low k materials include fluorinated silica glass (FSG), bis-benzocyclobuteues (BCB), carbon doped silicon oxide, amorphous fluorinated carbon, polyimide, or the like. In some embodiments, the insulating layers 134 are made of the same material as the first dielectric layer 110 and/or the dielectric material layer 120a.

Figure 9:
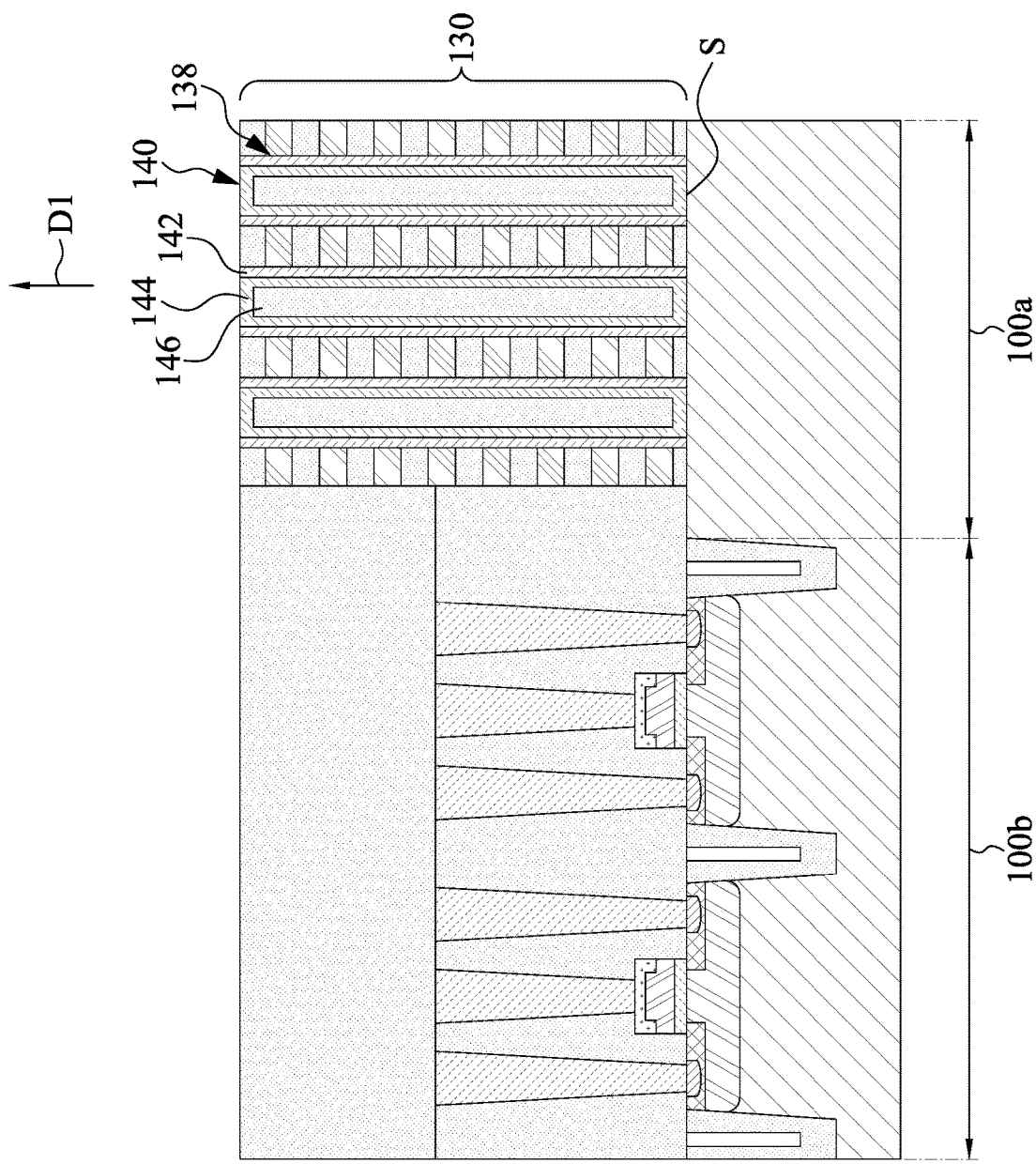

Reference is made to FIG. 9. In some embodiments, a plurality of data storage structures 140 are formed in the stack 130. Each data storage structure 140 is extended in the direction D1 according to some embodiments. Stated differently, the longitudinal directions of the data storage structures 140 are substantially perpendicular to the principal surface S of the memory array region 100a in these embodiments. In examples, each of the data storage structures 140 includes a data storage layer 142, an insulating material 146, and a semiconductor film 144 between the data storage layer 142 and the insulating material 146. The data storage layer 142 may include ONO (oxide-nitride-oxide), ONONO (oxide-nitride-oxide-nitride-oxide), or TANOS (tantalum nitride, aluminum oxide, silicon nitride, silicon oxide, silicon), for example. The semiconductor film 144, for example, may be made of polysilicon or other suitable semiconductor materials. The insulating material 146 may be made of, for instance, silicon oxide or low k materials. The insulating material 146 may be made of the same material as the insulating layers 134 (indicated in FIG. 8) according to yet some examples. The data storage structures 140 may be formed by any approach known in the art. Briefly, the stack 130 is selectively etched to form trenches 138 in the stack 130, and followed by the formation of data storage layer 142 on the sidewalls of the trenches 138. Thereafter, the semiconductor film 144 and the insulating material 146 are formed in the remaining spacing of the trenches 138.

Figure 10:
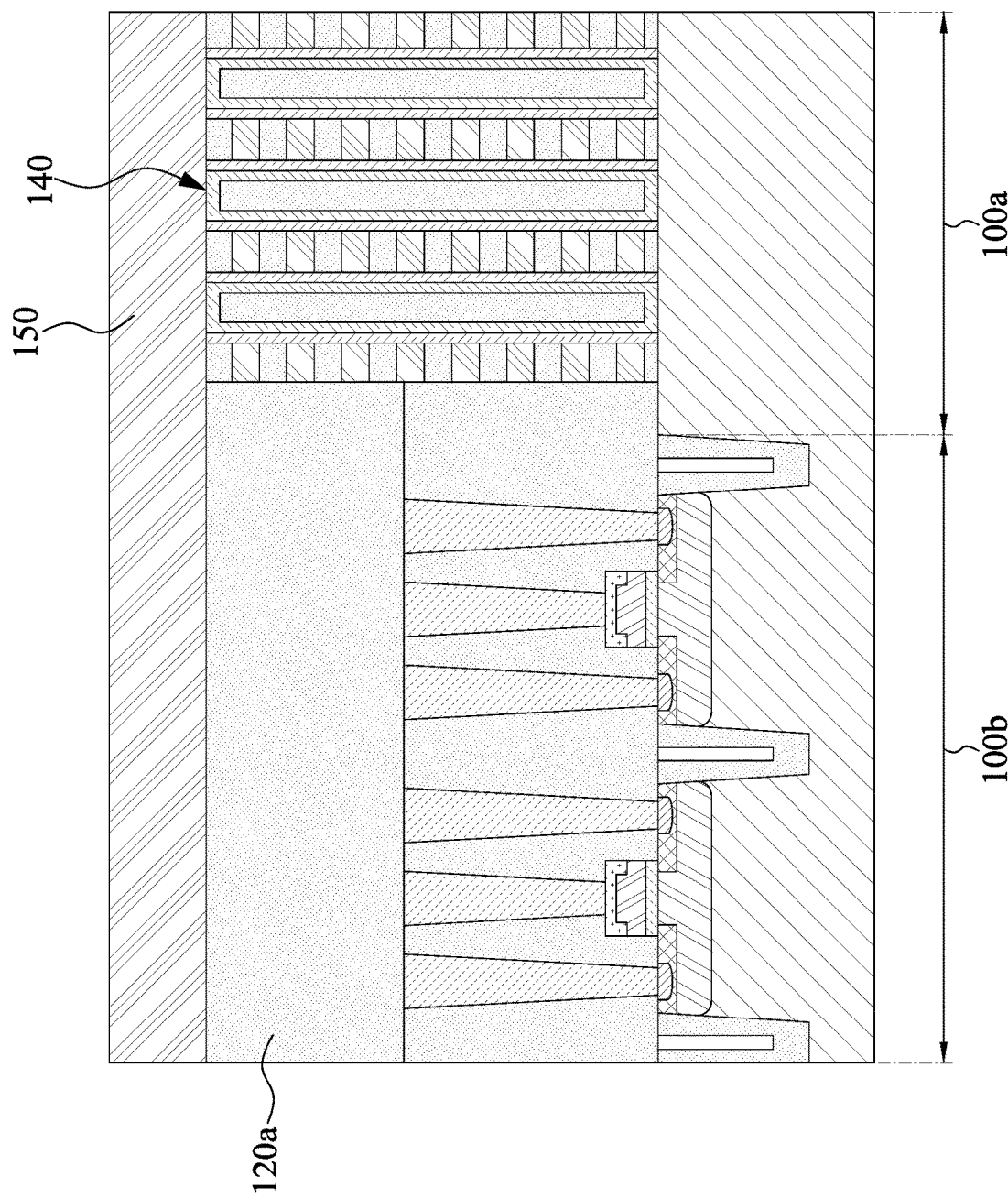

Reference is made to FIG. 10. In some embodiments, an interlayered dielectric layer 150 is formed over the data storage structures 140 on the memory array region 100a and over the dielectric material layer 120a on the peripheral circuit region 100b. The interlayered dielectric layer 150 may be formed by any known techniques and materials. In some examples, the thickness of the interlayered dielectric layer 150 is less than the total thickness of the first and second dielectric layers 110, 120.

Figure 11:
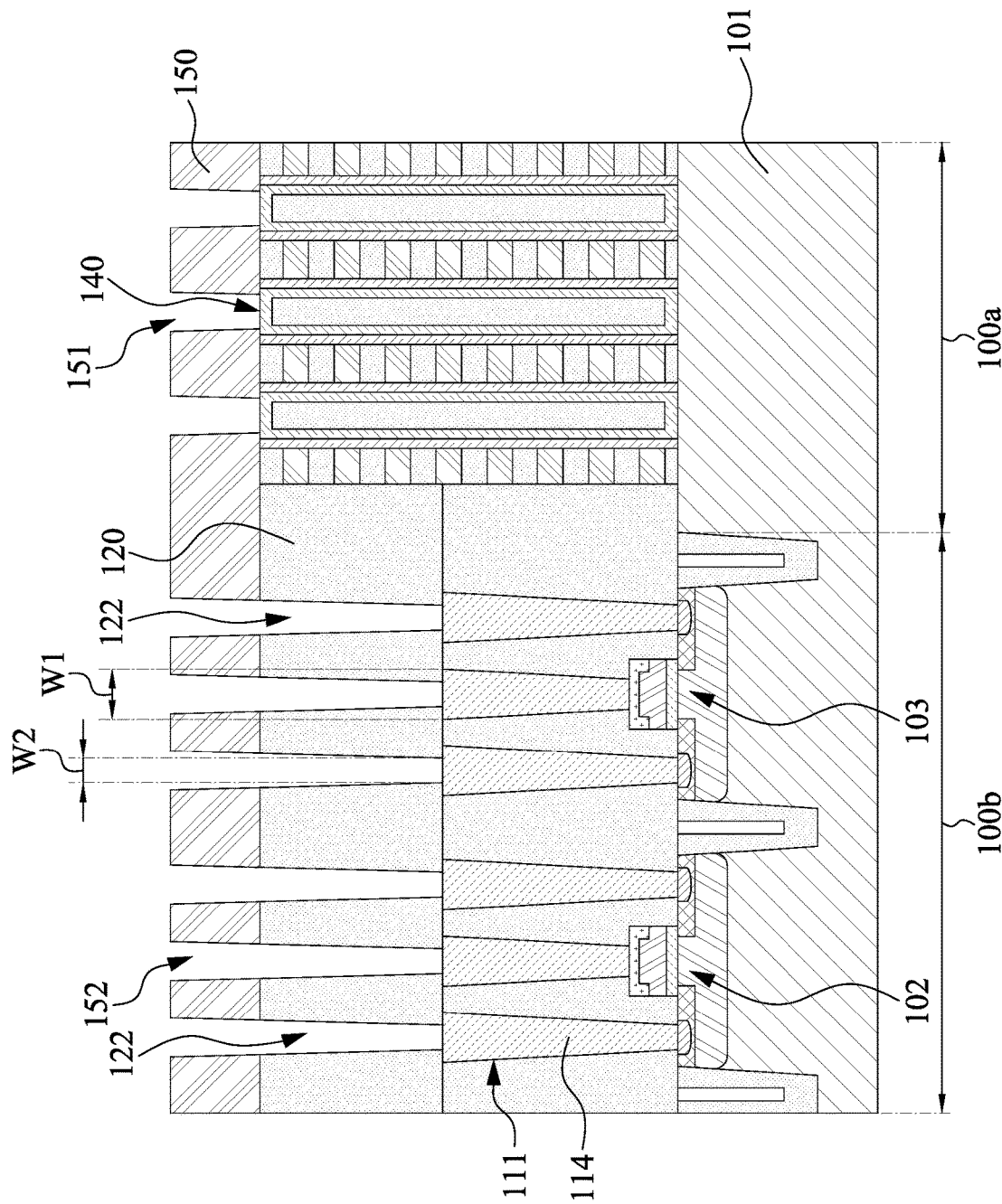

Reference is made to FIG. 11. In some embodiments, the dielectric material layer 120a is selectively etched to form a second dielectric layer 120 having at least a second through hole 122 (i.e., one or more second through holes 122) exposing the sacrificial material 114 in the first through hole(s) 111. As described above, in the embodiments where the interlayered dielectric layer 150 is formed, the step of selectively etching the dielectric material layer 120a further includes selectively etching the interlayered dielectric layer 150 to form a plurality of first contact holes 151 and a plurality of second contact holes 152. The first contact holes 151 expose the data storage structures 140 on the memory array region 100a, whereas the second contact holes 152 communicate with the second through holes 122 on the peripheral circuit region 100b. In some embodiments, the etching process of forming the second through holes 122 may substantially stop on the sacrificial material 114 or may slightly etch the sacrificial material 114. Moreover, the bottom width(s) W2 of the second through hole(s) 122 is/are less than the top width(s) W1 of the first through hole(s) 111. In some examples, each of the first and second through holes 111, 122 has an aspect ratio ranged from about 25 to about 50, for example 30, 35, 40, and 45. Although FIG. 11 illustrates a plurality of first through holes 111 and a plurality of second through holes 122, the present disclosure is not limited to the pluralities of the first and second through holes. For example, the present disclosure may be implemented by forming a single through hole 111 and a single second through hole 122.

Although the second through holes 122 described accompanying with FIG. 11 are formed after the formation of the stack 130, data storage structures 140 and interlayered dielectric layer 150, it is noted that the second through holes 122 may be formed prior to the formation of the stack 130, data storage structures 140 and/or interlayered dielectric layer 150. In some embodiments, the second through holes 122 may be formed prior to the formation of the stack 130. Particularly, the second through holes 122 may be formed immediately after forming the dielectric material layer 120a shown in FIG. 6 according to some examples. Alternatively, the second through holes 122 may be formed concurrently with the process shown in FIG. 7, i.e., etching the portions of the first dielectric layer 110 and the dielectric material layer 120a, according to yet some examples.

Although the stack 130 and data storage structures 140 described accompanying with FIGS. 8 and 9 are formed after the step 12 and step 14, the stack 130 and data storage structures 140 may be formed prior to the step 12 according to yet some embodiments. For instance, the stack 130 and data storage structures 140 may be formed on the semiconductor substrate 101 before forming the first dielectric layer 110 and/or the peripheral circuits (e.g., the HV pMOS 102 and LV nMOS 103) on the precursor substrate 100. Further, in yet some embodiments, the HV pMOS 102 and LV nMOS 103 may be formed at a level higher than the tops of the stack 130 and data storage structures 140 although FIGS. 9-11 depicts that the HV pMOS 102 and LV nMOS 103 are positioned at a level lower than the tops of the stack 130 and data storage structures 140.

Figure 12:
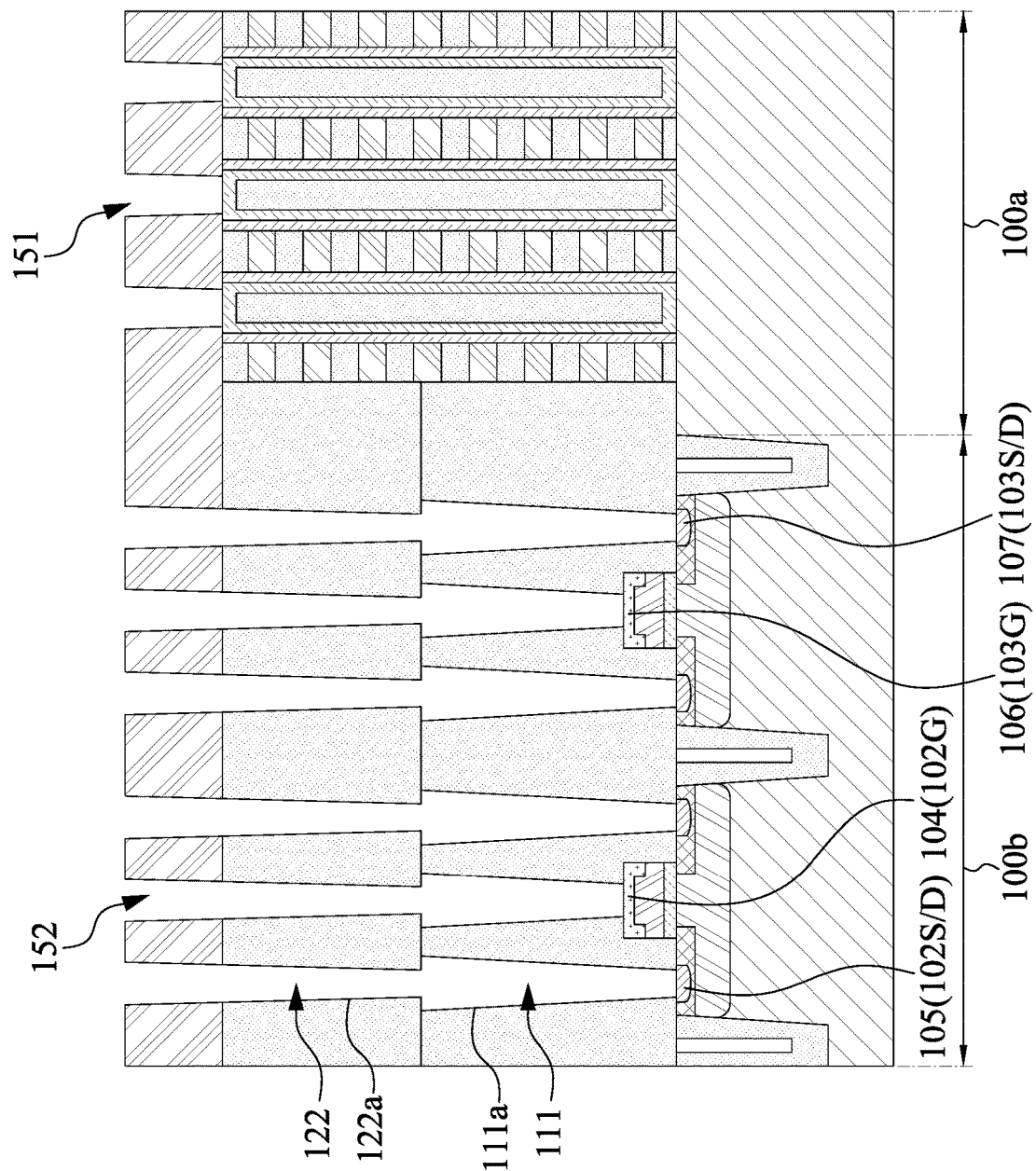

Referring back to FIG. 1, the method 10 proceeds to the step 18 by removing the sacrificial material after the formation of the second dielectric layer with the second through hole. As illustrated in FIG. 12, the sacrificial material 114 in the first through holes 111 are removed. For example, the sacrificial material 114 may be removed by a wet etching process using hot phosphoric acid solution as an etchant. After the removal of the sacrificial material 114, the sidewalls 111a, 122a of the first and second through holes 111, 122 are exposed, and the second through holes 122 communicate with the first through holes 111. In some embodiments, after the removal of the sacrificial material 114, the silicide features 104, 106 of the gates 102G, 103G and the conductive features 105, 107 of the source/drain regions 102S/D, 103S/D are exposed out through the first and second through holes 111, 122.

Figure 13:
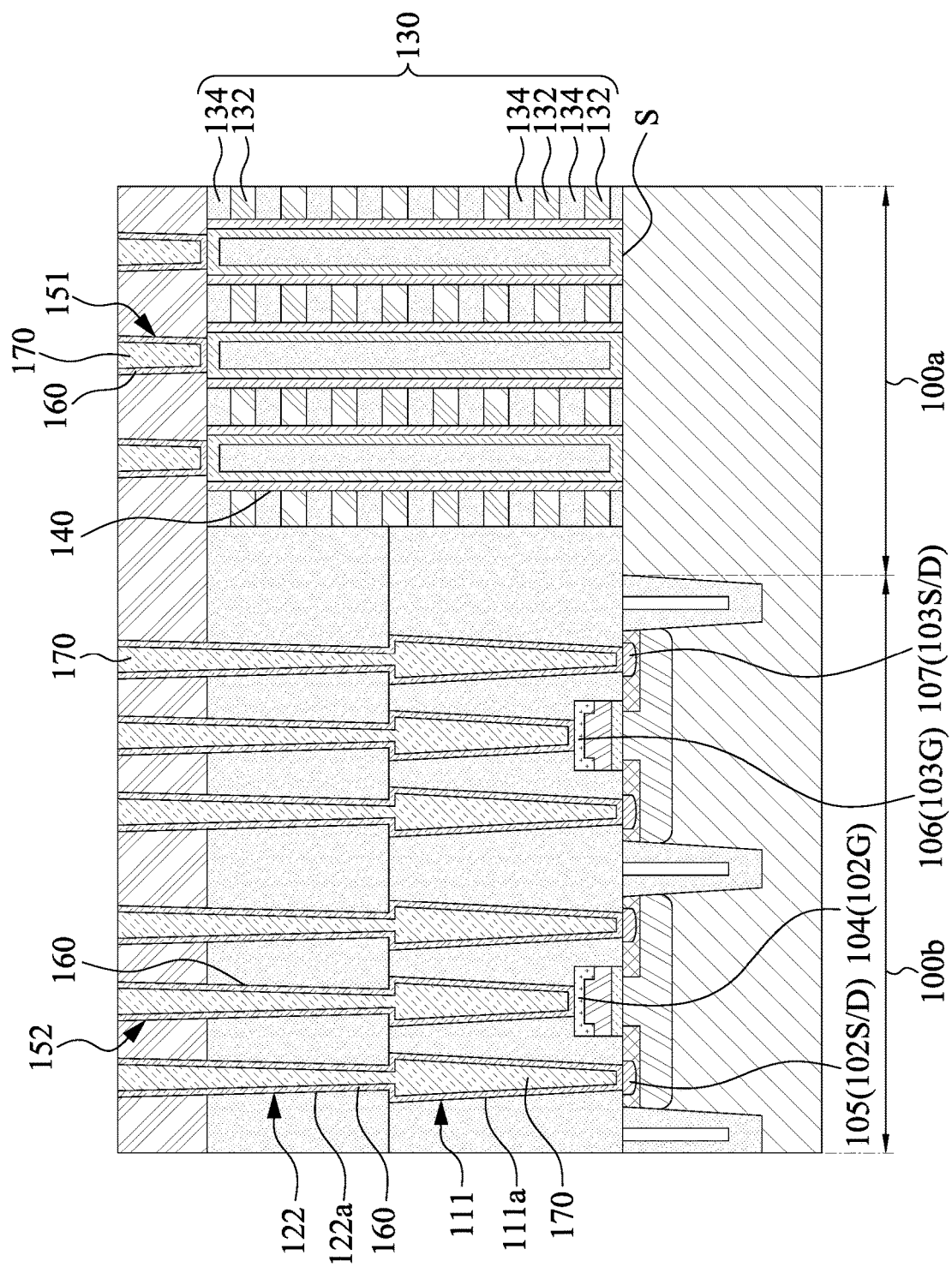

The method 10 proceeds to the step 20 of FIG. 1 by forming a barrier layer lining sidewalls of the first and second through holes. As illustrated in FIG. 13, a barrier layer 160 is formed lining the sidewalls 111a, 122a of the first and second through holes 111, 122. In various embodiments, the barrier layer 160 continues from the sidewall 111a of the first through hole 111 to the sidewall 122a of the second through hole 122. Particularly, the barrier layer 160 has a substantially zigzag profile in a cross section along the height direction of the first and second through holes 111, 122. In yet some embodiments, the barrier layer 160 is further formed on the bottom of the first through hole 111, and therefore the barrier layer 160 is in contact with the silicide features 104, 106 of the gates 102G, 103G and/or the conductive features 105, 107 of the source/drain regions 102S/D, 103S/D. In the embodiments where the interlayered dielectric layer 150 is formed with the first and second contact holes 151, 152, the first and second contact holes 151, 152 are lined with the barrier layer 160 as well. In embodiments, the barrier layer 160 may be formed by suitable CVD processes such as high density plasma (HDP) CVD processes, sub-atmospheric pressure CVD (SACVD) processes, flowable CVD processes and other suitable deposition techniques. Additionally, the barrier layer 160 may also be referred to as "adhesive layer". In some embodiments, the barrier layer 160 may include titanium, titanium nitride, tantalum nitride, or a combination thereof, or the like. In yet some embodiments, the barrier layer 160 may include silicon nitride (SiN), silicon oxynitride (SiON), or a combination thereof, or the like.

The method 10 proceeds to the step 22 of FIG. 1 by forming a conductive material in the first and second through holes. Reference is still made to FIG. 13. A conductive material 170 is formed filling the first and second through holes 111, 122. Specifically, while the first and second through holes 111, 122 are lined with the barrier layer 160, remaining spacing is present in the first and second through holes 111, 122. The conductive material 170 is filled in the remaining spacing of the first and second through holes 111, 122. In the embodiments where the interlayered dielectric layer 150 is formed with the first and second contact holes 151, 152, the conductive material 170 fills the first and second contact holes 151, 152 as well. In examples, the conductive material 170 may be formed of tungsten, aluminum, AlSi, WSi, copper, or alloy including tungsten, or the like.

According to some embodiments of the present disclosure, the barrier layer 160 and the conductive material 170 may be formed by the approaches described below. First, a layer of barrier material is deposited in a conformal and blanket manner such that the inner surfaces of the first and second through holes 111, 122 and the inner surfaces of the first and second contact holes 151, 152 are lined with the barrier material, in which the interlayered dielectric layer 150 is covered as well. Thereafter, a layer of conductive material is deposited filling the first and second through holes 111, 122 and the first and second contact holes 151, 152 and over the interlayered dielectric layer 150. Subsequently, a CMP or etching back process may be carried out to remove the extra barrier and conductive materials deposited over the interlayered dielectric layer 150, thereby forming the barrier layer 160 and the conductive material 170 depicted in FIG. 13.

The method disclosed herein provides various advantages in manufacturing processes and semiconductor devices. In specifics, the method is suitable for the formation of the contact via with a high aspect ratio (e.g., greater than 30 or more), in which particularly the barrier layer 160 is continuous from the sidewall 111a of the first through hole 111 to the sidewall 122a of the second through hole 122. There is no any barrier layer interposed in the conductive material 170. In addition, the method disclosed herein may prevent the conductive material 170 from forming metal oxide in the first and second through holes 111, 122 because the conductive material 170 is formed using a single deposition process. Accordingly, the formed via contact is reliable in electrical performance and is robust in manufacturing processes. Furthermore, with reference to FIG. 5, because the sacrificial material 114 is formed in the first through hole 111 on the silicide feature, the sacrificial material 114 suppresses or mitigates the diffusion of the silicide into the dielectric layer during the formation of the data storage structures 140 (with reference to FIGS. 8-9). These and other advantages are better understood as comparing with the comparative example illustrated in FIGS. 17-24, and are described in more detail hereinafter.

Figure 14:
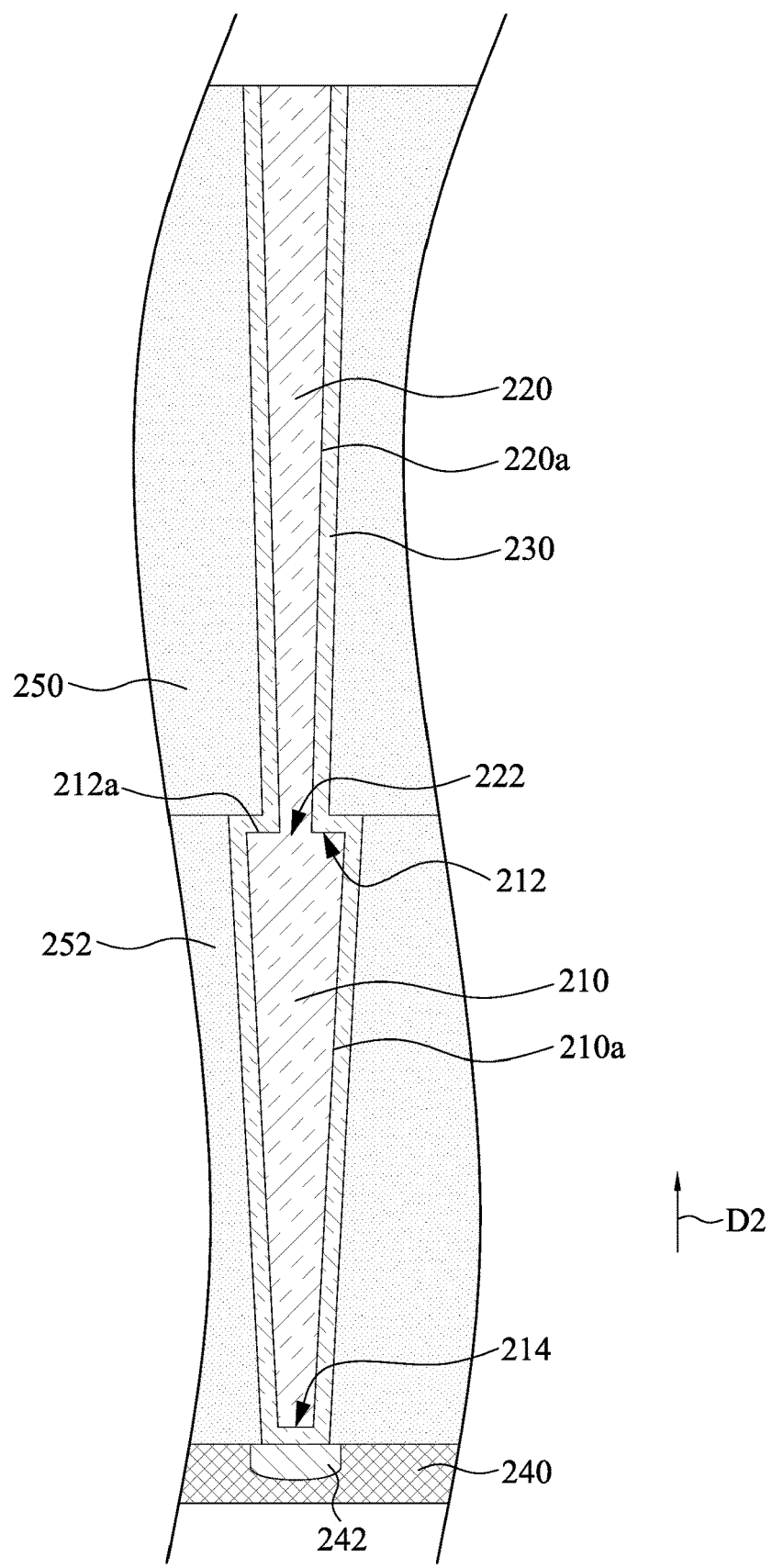
FIG. 14 is a cross-sectional view schematically illustrating a via contact according to various embodiments of the present disclosure.

According to another aspect of the present disclosure, a via contact is provided. FIG. 14 is a cross-sectional view schematically illustrating a via contact 200 according to various embodiments of the present disclosure. The via contact 200 may be formed in semiconductor devices such as memory devices or other functional devices. For example, the via contact 200 may be formed over the peripheral circuit regions of 3D NAND FLASH memory devices. As shown in FIG. 14, the via contact 200 at least includes a first conductive structure 210, a second conductive structure 220, and a barrier layer 230.

The first conductive structure 210 is over and aligned with a conductive feature 242 of a semiconductor substrate 240 according to some embodiments. The first conductive structure 210 includes a top 212 and a bottom 214, in which the width and/or cross-sectional area of the top 212 is greater than that of the bottom 214. The first conductive structure 210 has a longitudinal direction D2 substantially perpendicular to the surface of the semiconductor substrate 240.

The second conductive structure 220 is disposed on the top 212 of the first conductive structure 210. In some embodiments, the second conductive structure 220 is extended upwards from the top 212 of the first conductive structure 210 in the longitudinal direction D2. The second conductive structure 220 has a bottom 222 in contact with the top 212 of the first conductive structure 210. The width and/or cross-sectional area of the bottom 222 of the second conductive structure 220 are less than that of the top 212 of the first conductive structure 210. The term "cross-sectional area" used herein (associated with the top 212 and the bottom 222) is defined in a cutting plane perpendicular to the direction D2. Accordingly, a portion 212a of the top 212 is unoccupied by the bottom 222 of the second conductive structure 220. In some examples, each of the first and second conductive structures 210, 220 has an aspect ratio ranged from about 25 to about 50, for example 30, 35, 40, and 45.

The barrier layer 230 wraps sidewalls 210a, 220a of the first and second conductive structures 210, 220. The barrier layer 230 further covers the unoccupied portion 212a of the top 212 of the first conductive structure 210. It is noted that the barrier layer 230 is continuous from the sidewall 210a of the first conductive structure 210 through the unoccupied portion 212a of the top 212 to the sidewall 220a of the second conductive structure 220. In various embodiments, the barrier layer 230 has a substantially zigzag profile in a cross section along the direction D2 (also referred to as "height direction"). In some embodiments, the barrier layer 230 wraps the bottom 214 of the first conductive structure 210.

According to some embodiments, the via contact 200 may be embedded in dielectric layers 250, 252 on the semiconductor substrate 240. In examples, the dielectric layers 250, 252 surround the outer sidewall of the barrier layer 230, in which the sidewalls of the first and second conductive structures 210, 220 are wrapped by the barrier layer 230.

Figure 15:
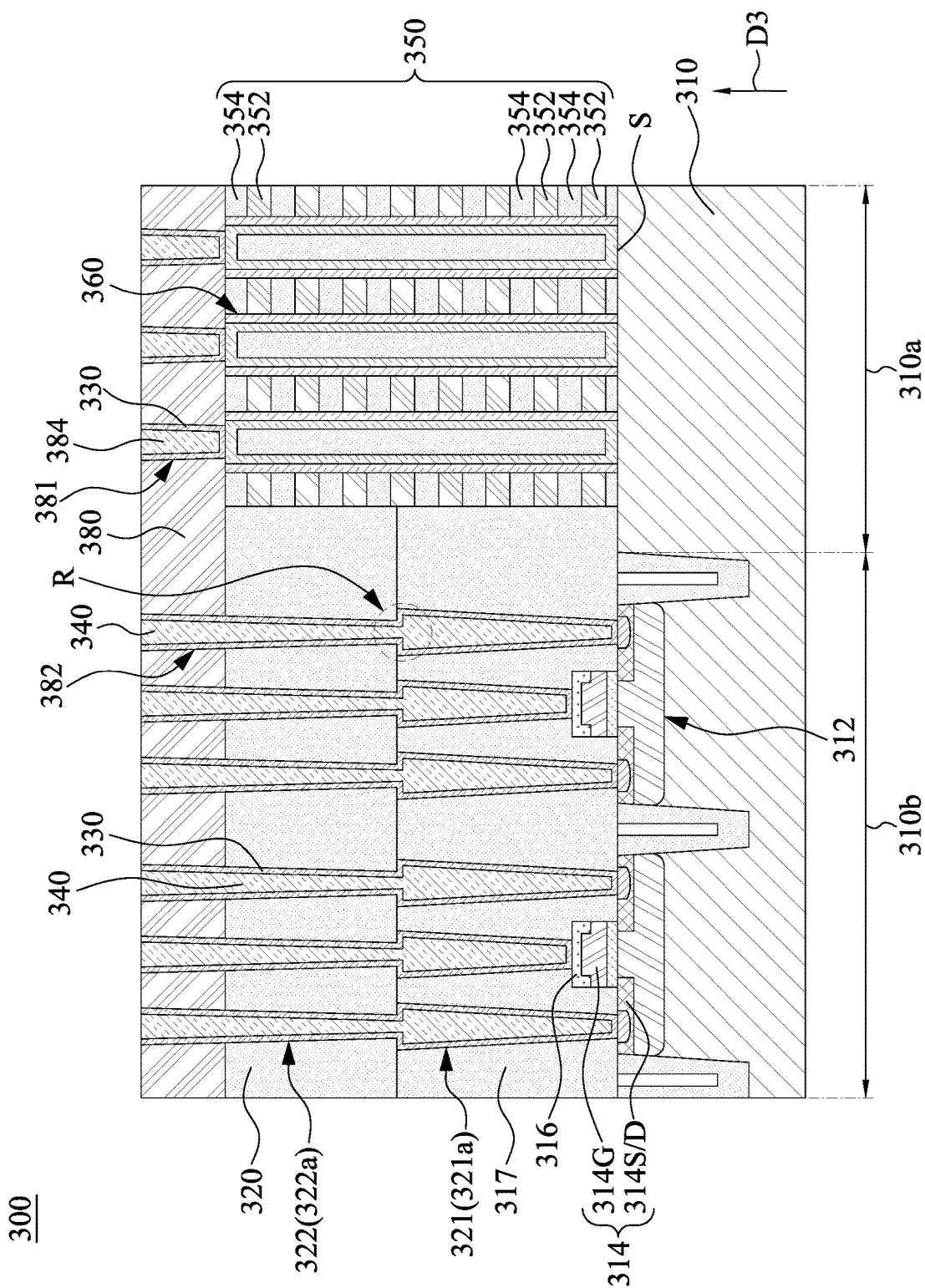
FIG. 15 is a cross-sectional view schematically illustrating a memory device according to various embodiments of the present disclosure.

According to another aspect of the present disclosure, a memory device is provided. FIG. 15 is a cross-sectional view schematically illustrating a memory device 300 according to various embodiments of the present disclosure. The memory device 300 at least includes a semiconductor substrate 310, dielectric layers 317, 320, a barrier layer 330, and a conductive plug 340.

The semiconductor substrate 310 includes a memory array region 310a and a peripheral circuit region 310b adjacent to the memory array region 310a. Although FIG. 15 merely shows a portion of the memory device 300, the peripheral circuit region 310b may surround the memory array region 310a according to some embodiments. The semiconductor substrate 310 further includes a peripheral circuit 312 located on the peripheral circuit region 310b. In some embodiments, the peripheral circuit 312 includes a transistor 314 (such as HV pMOS or LV nMOS) having a gate 314G and source/drain regions 314S/D. A silicide 316 may be formed on the gate 314G and/or the source/drain regions 314S/D of the transistor 314 in some examples. On the memory array region 310a, a plurality of data storage structures are arranged thereon, which is described in detail hereinafter.

The dielectric layers 317, 320 are disposed over the peripheral circuit 312. The dielectric layers 317, 320 respectively have a first via 321 and a second via 322 that is above and connected with the first via 321. FIG. 16A is an enlarge view illustrating the region R of FIG. 15. FIG. 16B is a plan view illustrating the first via 321 and the second via 322 along a cutting plan C in the region R. As illustrated FIGS. 16A and 16B, the second via 322 has a bottom width W2 and bottom area 322B that are respectively less than the top width W1 and top area 321T of the first via 321 so that the dielectric layer 320 has an overhang 324 at the junction of the first via 321 and the second via 322. In embodiments, the overhang 324 has a bottom surface 324b extending from the sidewall 321a of the first via 321 to the sidewall 322a of the second via 322. According to some embodiments, the dielectric layers 317, 320 respectively have a plurality of first vias 321 and a plurality of second vias 322, as illustrated in FIG. 15. Each second via 322 is above and connected with a corresponding one of the first vias 321, and each of the first vias 321 and each of the second vias 322 have the structure the same as or similar to that illustrated in FIGS. 16A and 16B.

The barrier layer 330 continuously lines the sidewalls 321a, 322a of the first and second vias 321, 322 and the overhang 324. Particularly, the barrier layer 330 continuously extends from the sidewall 321a of the first via 321 through the bottom surface 324b of the overhang 324 to the sidewall 322a of the second via 322. The first and second vias 321, 322 are partially filled with the barrier layer 330, and there exists remaining spacing in the first and second vias 321, 322. For example, the barrier layer 330 may has a thickness ranged from tens of angstroms to tens of nanometers. In some embodiments, as shown in FIG. 15, the barrier layer 330 has a substantially zigzag profile in a cross section along the height direction D3 of the first and second vias 321, 322. In yet some embodiments, the barrier layer 330 is further formed on the bottom of the first via 321, and therefore the barrier layer 330 is in contact with the silicide 316 on the transistor 314. Although the barrier layer 330 is depicted as a single layer in FIGS. 15 and 16A, it is noted that the barrier layer 330 may include a plurality of sublayers (i.e., a composite layer) such that the barrier layer 330 provide both functions of barrier and adhesion according to some embodiments. Therefore, the barrier layer 330 may also be referred to as an adhesive layer.

The conductive plug 340 is filled in the first via 321 and the second via 322. In some embodiments, the conductive plug 340 is filled in the remaining spacing in the first via 321 and the second via 322. Although FIGS. 15, 16A and 16B show only the barrier layer 330 and the conductive plug 340 formed in the first and second vias 321, 322, other layers may be formed between the barrier layer 330 and the conductive plug 340. In some embodiments, the conductive plug 340 is wrapped with the barrier layer 330, except the top of the conductive plug 340. According to yet some embodiments, the conductive plug 340 is aligned with the silicide 316 over the peripheral circuit 312. In the embodiments where the dielectric layers 317, 320 respectively have the pluralities of first vias 321 and second vias 322, the memory device 300 includes a plurality of conductive plugs 340. Each of the conductive plugs 340 is filled in a corresponding first via 321 and a corresponding second via 322. Therefore, some of the conductive plugs 340 may be connected with the gate 314G of the transistor 314, and yet some of the conductive plugs 340 may be connected with the source/drain regions 314S/D of the transistor 314. Illustrative examples of the material for the conductive plugs 340 include tungsten, aluminum, aluminum silicide, tungsten silicide, copper, and the like.

In some embodiments, the memory device 300 may further include a stack 350 which includes alternately stacked conductive layers 352 and insulating layers 354 on the memory array region 310a. The embodiments of the stack 350 may be the same as or similar to these described hereinbefore in connection with the stack 130 in FIG. 8, and therefore is not repeatedly described herein.

In some embodiments, the memory device 300 may further include a plurality of data storage structures 360 on the memory array region 310a. Each of the data storage structures 360 penetrates through the stack 350 according to some examples. The embodiments of the data storage structures 360 may be the same as or similar to these described hereinbefore in connection with the data storage structures 140 in FIG. 9, and therefore is not repeatedly described herein.

In other embodiments, the memory device 300 may further include an interlayered dielectric layer 380 on the dielectric layer 320. According to some embodiments, the interlayered dielectric layer 380 may has a plurality of first contact holes 381 and a plurality of second contact holes 382. In some examples, the inner surfaces of the first and second contact holes 381, 382 are lined with the barrier layer 330. In yet some examples, each first contact holes 381 is aligned with a corresponding data storage structure 360. According to yet some embodiments, the memory device 300 may further include a plurality of contact plugs 384 filled in the remaining spacing of the first contact holes 381. In other embodiments, each second contact hole 382 is connected to a corresponding second via 322 of the dielectric layer 320, and therefore the second contact holes 382 are filled with the conductive plugs 340.

FIGS. 17-24 are cross-sectional views collectively illustrating a method of forming a semiconductor structure according to a comparative example of the present disclosure. As comparing the method of FIGS. 17-24 with the embodiments of the present disclosure, one skilled in the art may have a better understanding to the various advantages of the present disclosure.

Figure 17:
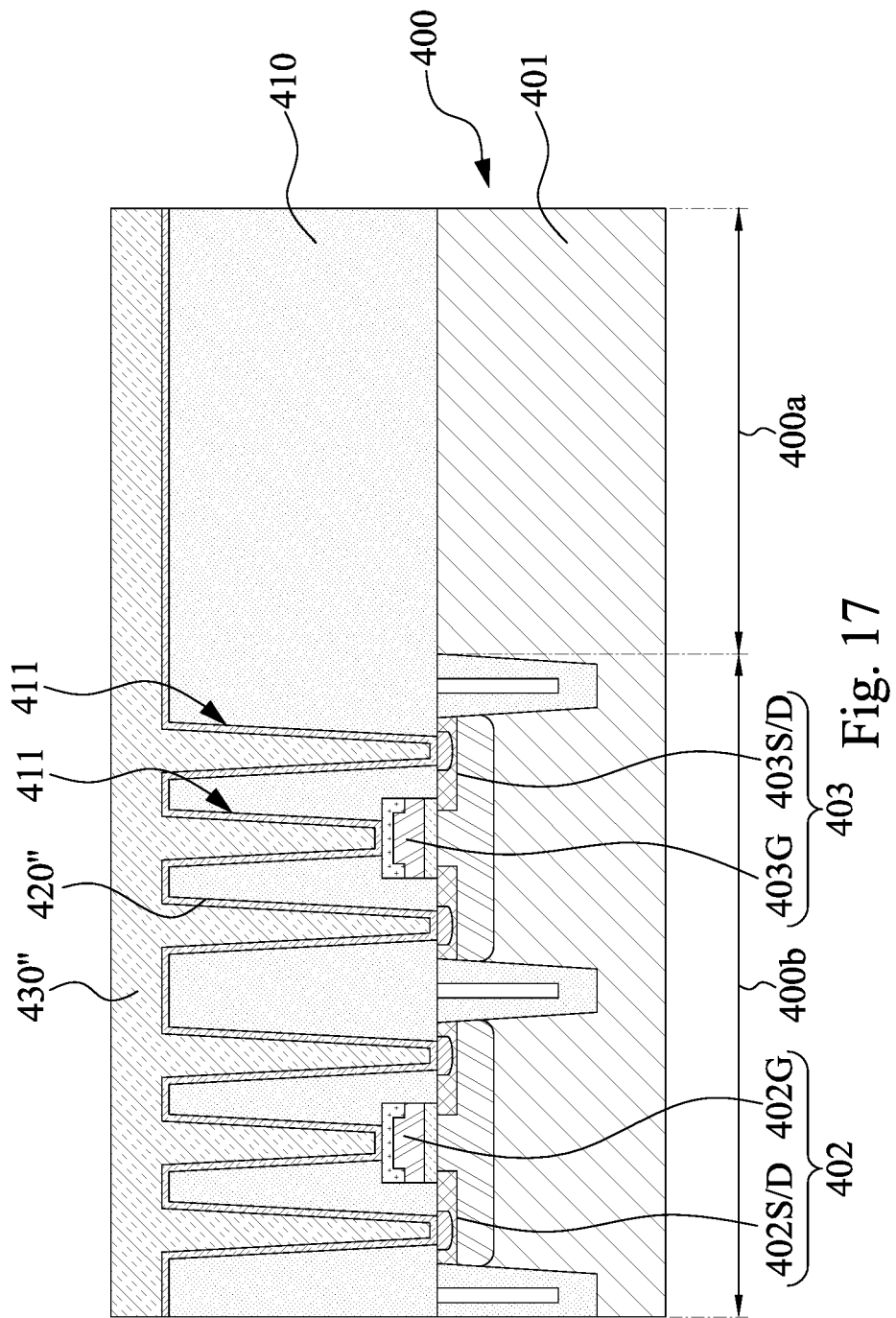
FIGS. 17-24 are cross-sectional views collectively illustrating a method of forming a semiconductor structure according to a comparative example of the present disclosure.

In FIG. 17, a first dielectric layer 410 is formed over a precursor substrate 400. The precursor substrate 400 includes a semiconductor substrate 401 having a memory array region 400a and a peripheral circuit region 400b adjacent to memory array region 400a. The precursor substrate 400 further includes a HV pMOS 402 and a LV nMOS 403 on the peripheral circuit region 400b. The HV pMOS 402 includes a gate 402G and source/drain regions 402S/D. Similarly, the LV nMOS 403 includes a gate 403G and source/drain regions 403S/D. The first dielectric layer 410 is formed with a plurality of first through holes 411. Some of the first through holes 411 expose the gates 402G, 403G, whereas some of the first through holes 411 expose the source/drain regions 402S/D, 403S/D. Thereafter, a first barrier material 420" is deposited lining the first through holes 411 and covering the first dielectric layer 410, and then a first conductive material 430" is deposited on the first barrier material 420" and filling the first through holes 411.

Figure 18:
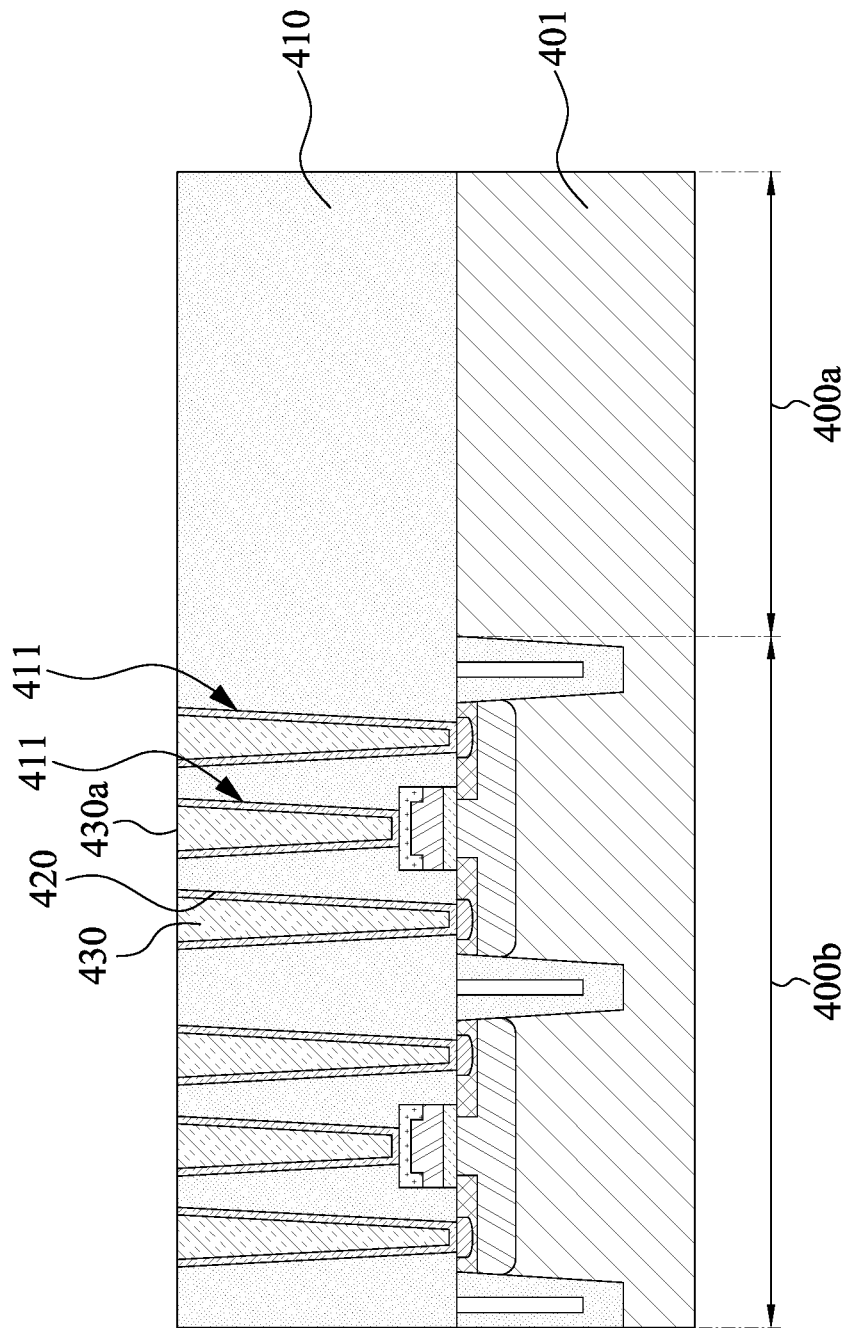

In FIG. 18, an etching back process or a CMP process is carried out to remove the extra material deposited over the first dielectric layer 410. Accordingly, a first barrier layer 420 is formed lining the first through holes 411, and a plurality of first conductive plugs 430 are formed filling the first through holes 411.

Figure 19:
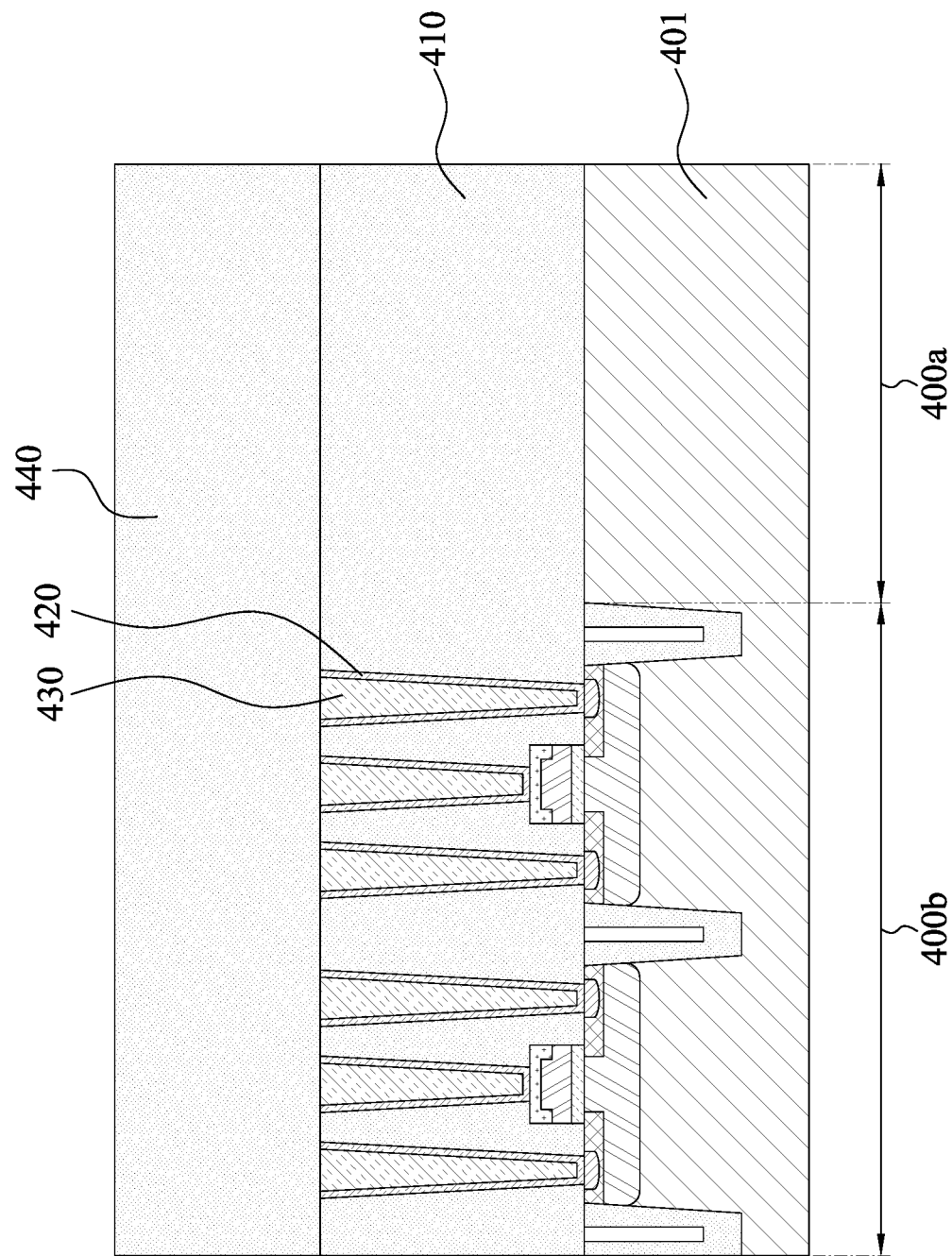

In FIG. 19, a second dielectric layer 440 is formed covering the first dielectric layer 410, the first barrier layer 420 and the first conductive plugs 430.

Figure 20:
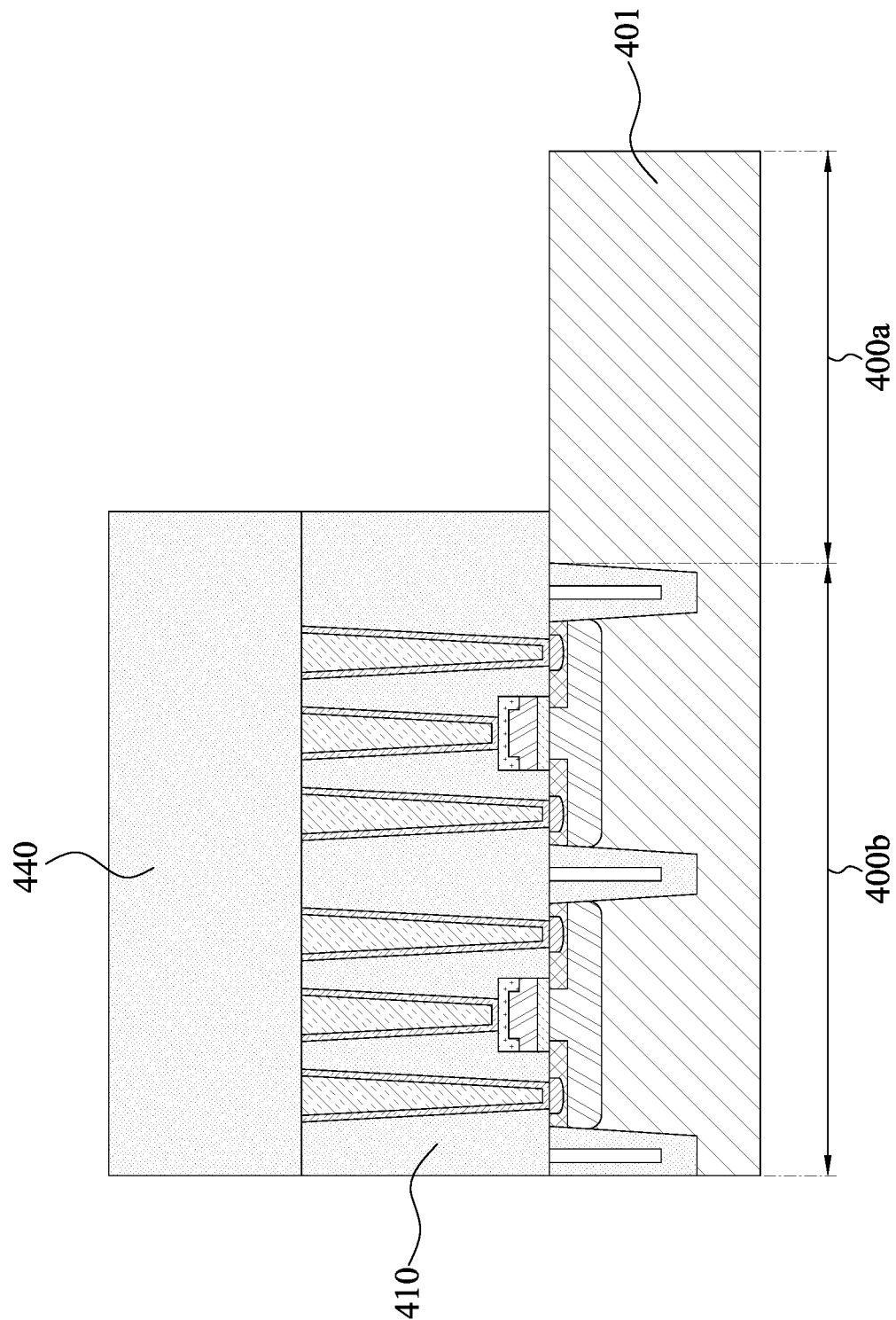

In FIG. 20, portions of the first and second dielectric layers 410, 440 are removed to expose the memory array region 400a. The remaining portions of the first and second dielectric layers 410, 440 still cover the peripheral circuit region 400b.

Figure 21:
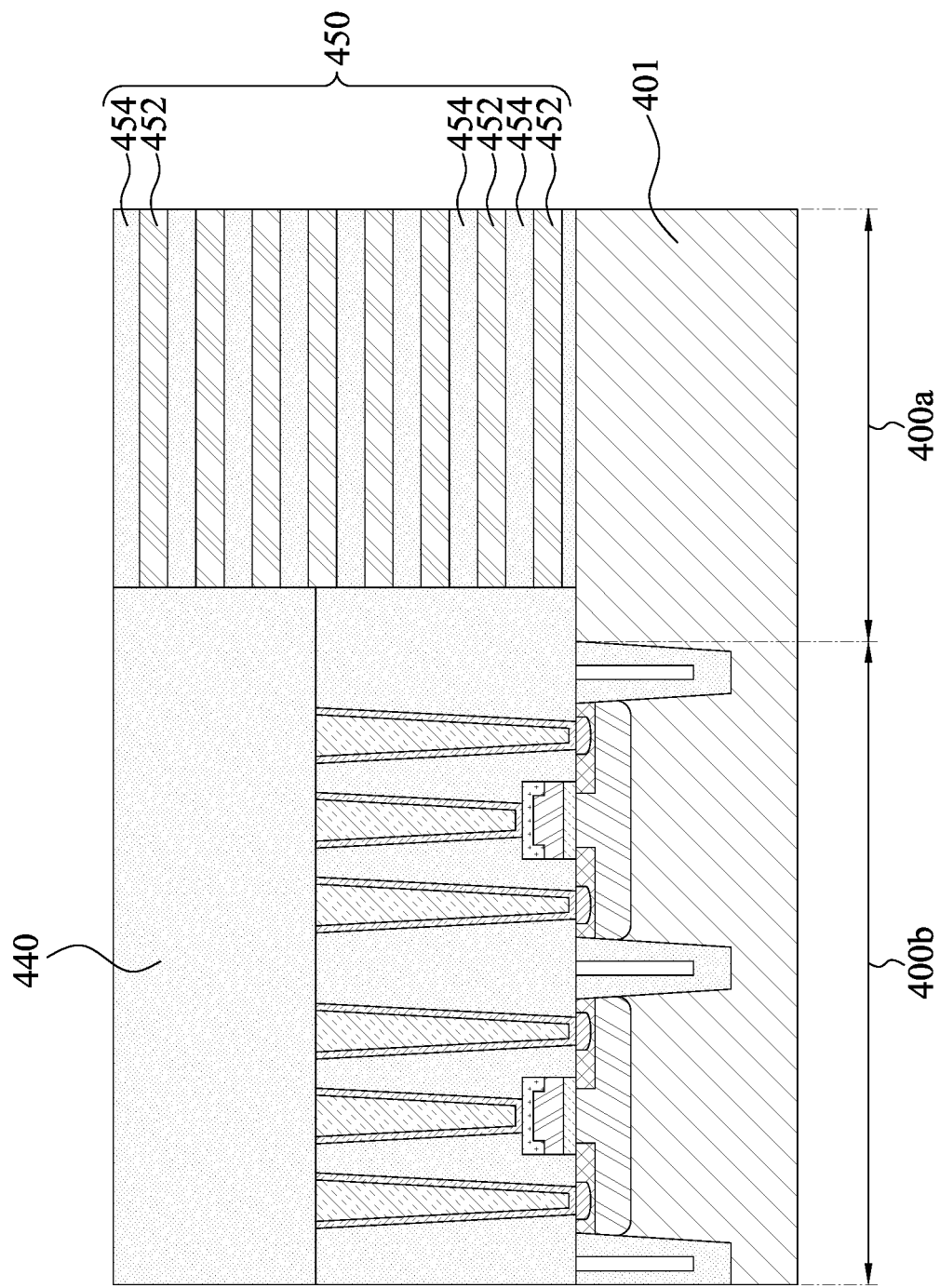

In FIG. 21, a stack 450 including a plurality of conductive layers 452 and a plurality of insulating layers 454 are formed on the memory array region 400a, in which the conductive layers 452 and the insulating layers 454 are alternately stacked. During the formation of the stack 450, a plurality of conductive wirings 456 is formed concurrently. Each of the conductive wirings 456 is connected to a corresponding one of the conductive layers 452.

Figure 22:
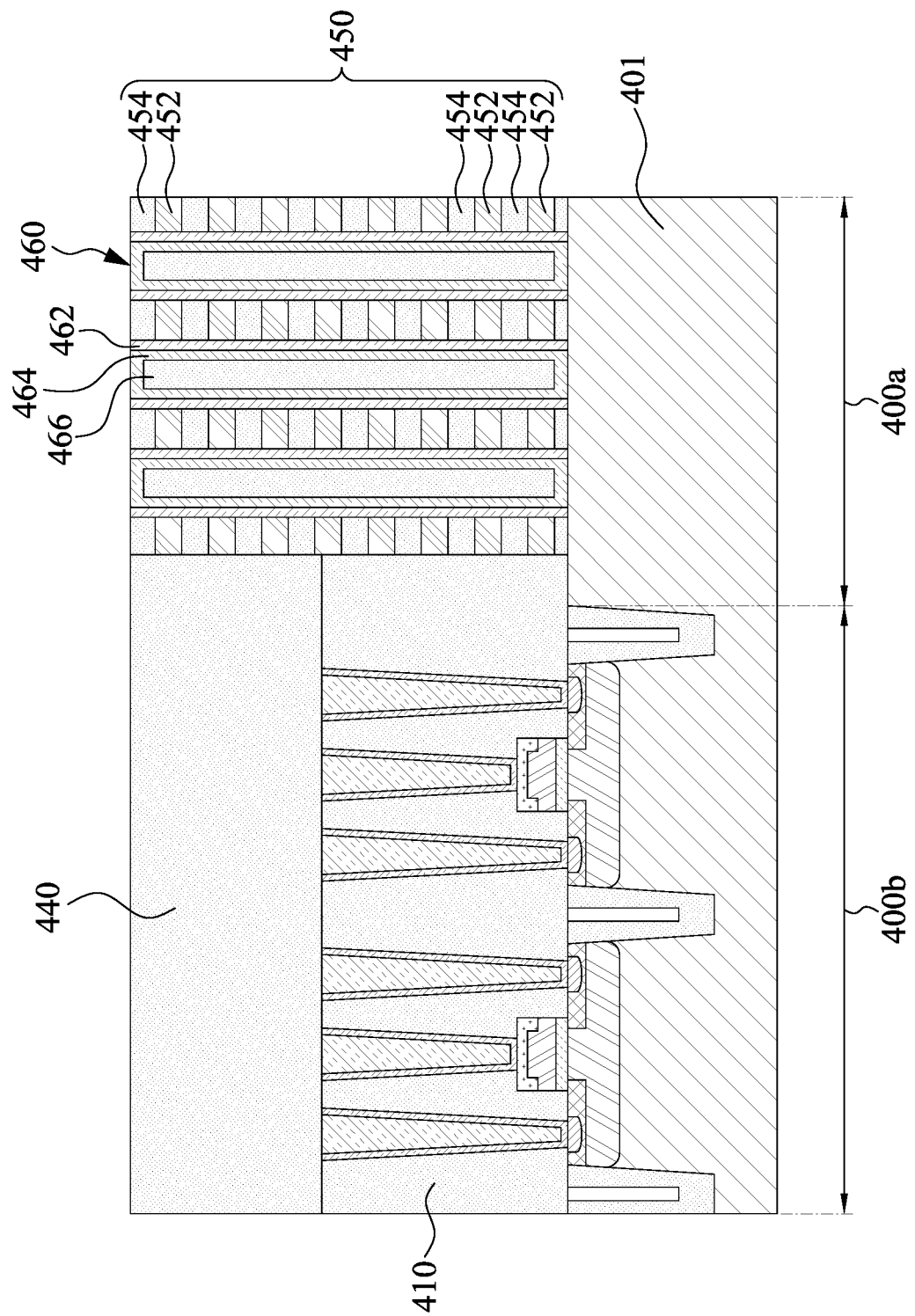

In FIG. 22, a plurality of data storage structures 460 are formed in the stack 450. Each of the data storage structures 460 includes a data storage layer 462, an insulating material 466, and a semiconductor film 464 between the data storage layer 462 and the insulating material 466.

Figure 23:
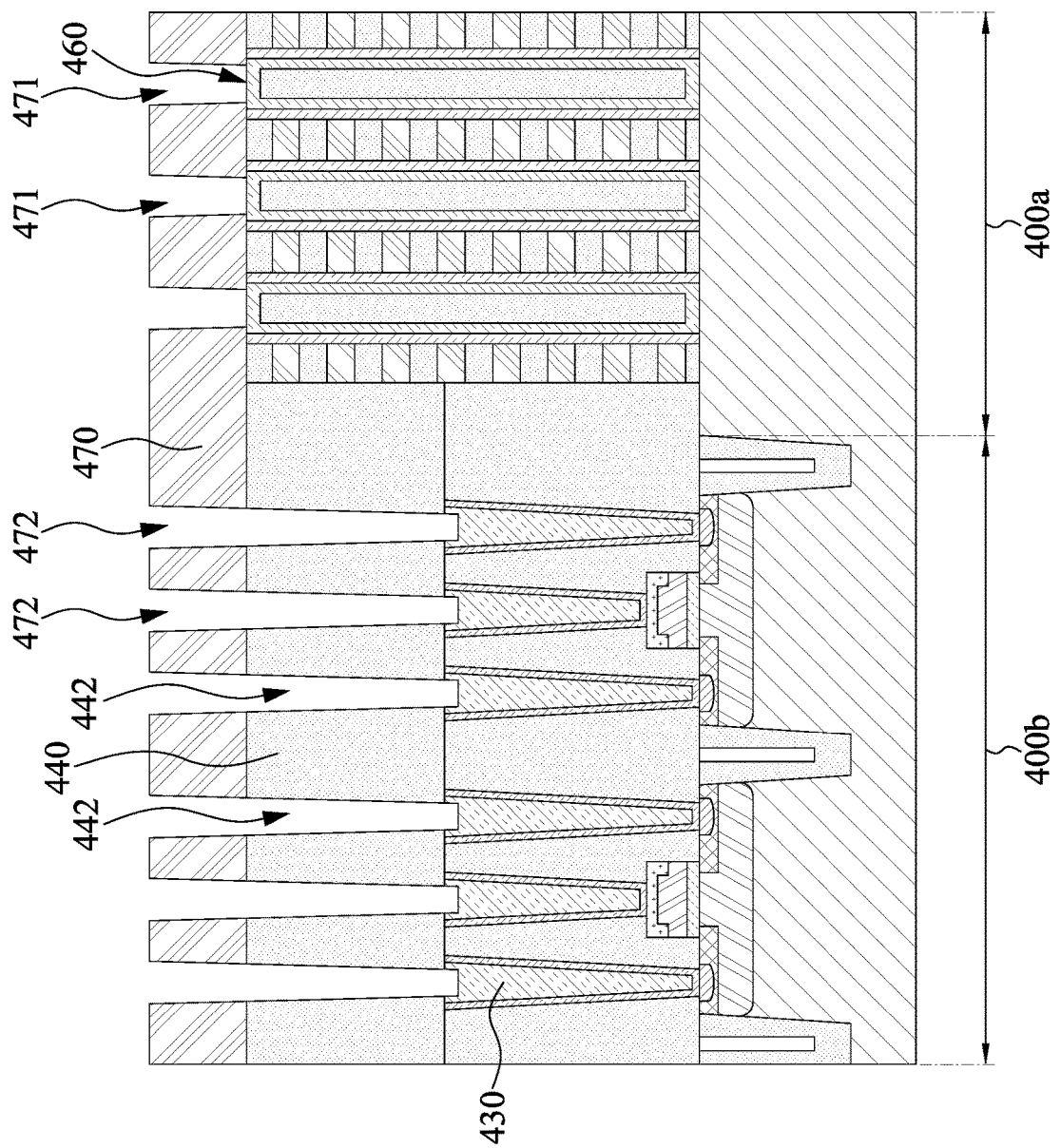

In FIG. 23, an interlayered dielectric layer 470 is formed in a blanket manner to cover the second dielectric layer 440, the stack 450, and the data storage structures 460. Thereafter, the interlayered dielectric layer 470 and the second dielectric layer 440 are etched to form first contact holes 471 and second contact holes 472 in the interlayered dielectric layer 470 as well as second through holes 442 in the second dielectric layer 440. The first contact holes 471 expose the data storage structures 460. The second contact holes 472 are positioned on the peripheral circuit region 400b. The second through holes 442 pass through the second dielectric layer 440. The second contact holes 472 are aligned and communicated with the second through holes 442, thereby exposing the first conductive plugs 430.

Figure 24:
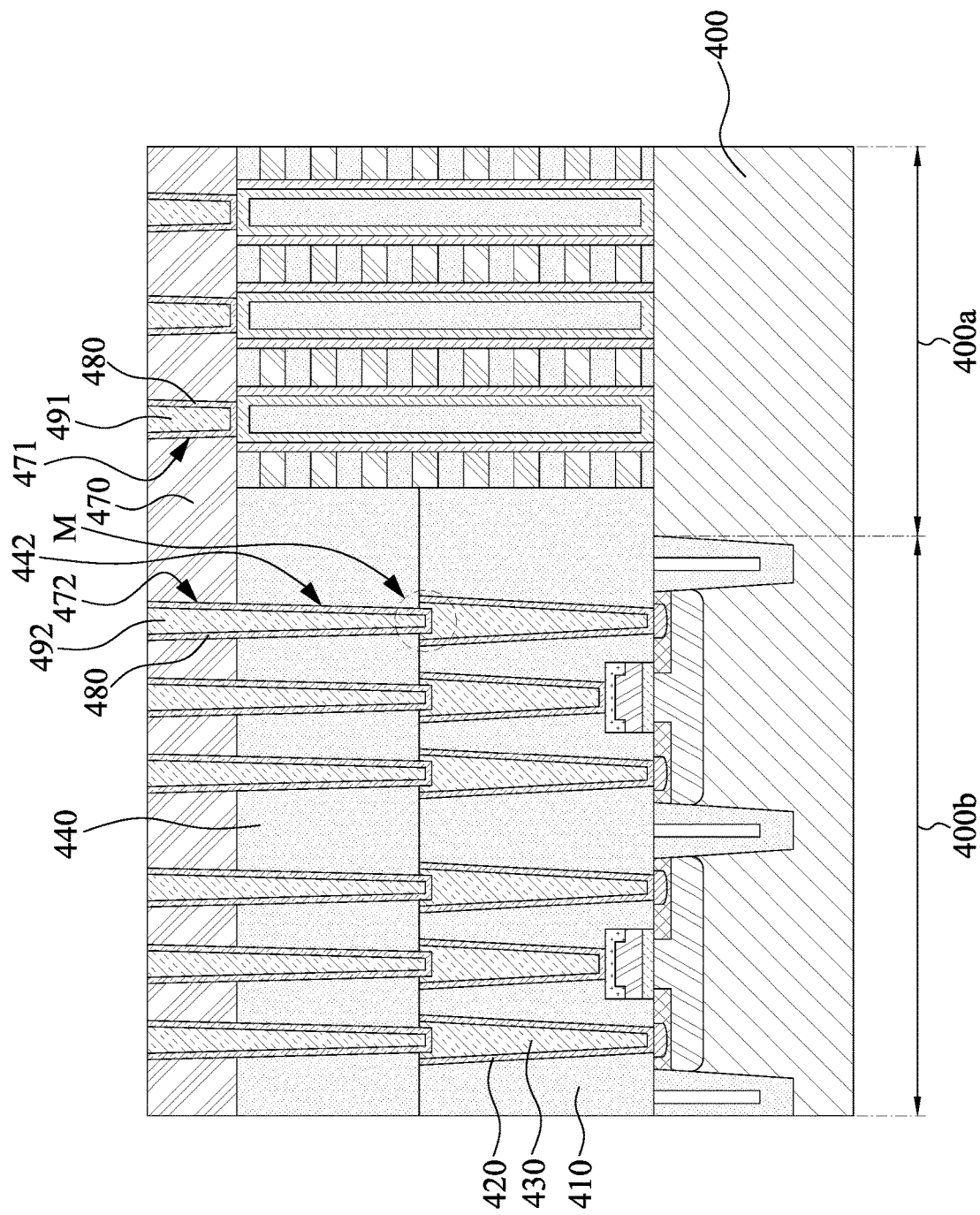

In FIG. 24, a second barrier layer 480 is formed lining the inner surfaces of the first and second contact holes 471, 472 and the second through holes 442. Thereafter, a second conductive material is deposited filling the remaining spacing in the first and second contact holes 471, 472 and the second through holes 442, thereby forming contact plugs 491 in the first contact holes 471, and forming second conductive plugs 492 in the second through holes 442 and the second contact holes 472.

Figure 25:
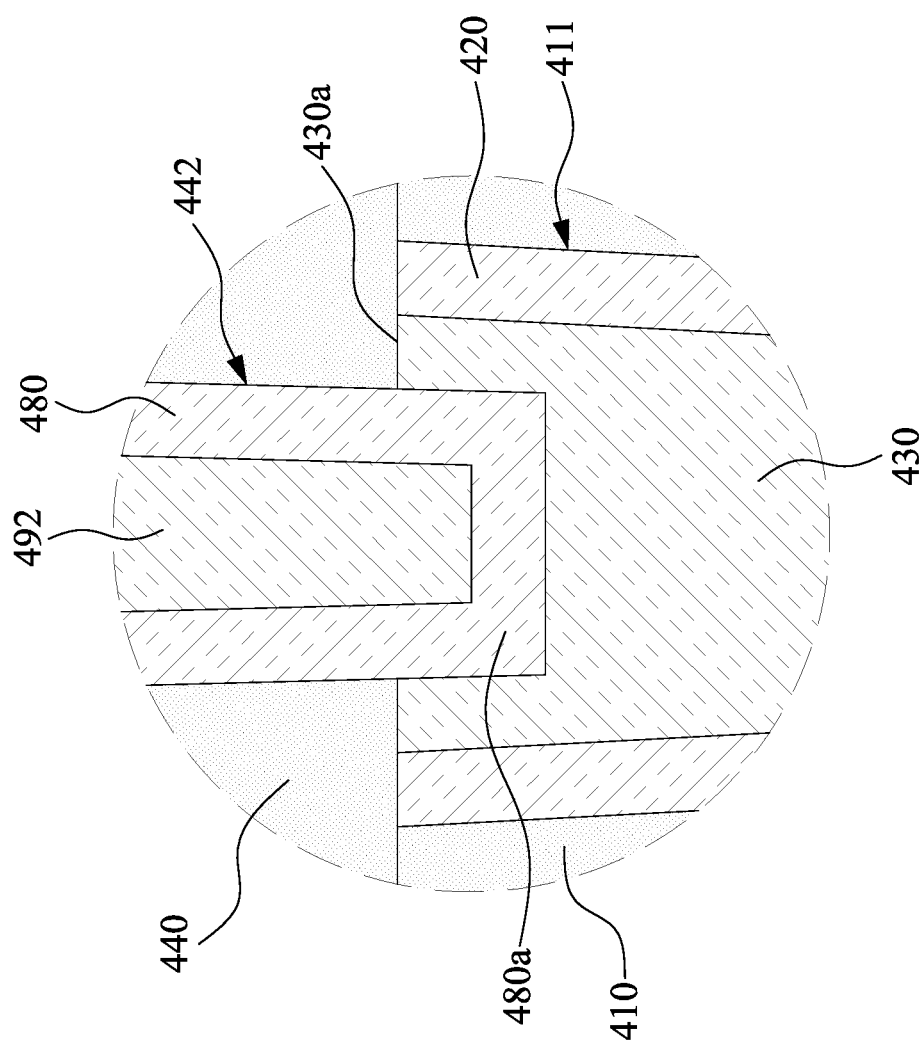
FIG. 25 is an enlarged view illustrating the region M of FIG. 24.

FIG. 25 is an enlarged view illustrating the region M of FIG. 24. As shown, it is noted that the first barrier layer 420 is not physically connected with the second barrier layer 480. Particularly, a portion of the top 430a of the first conductive plugs 430 is uncovered by any of the first barrier layer 420 and the second barrier layer 480, leading to a degrade in the reliability of the contact structure. Furthermore, the bottom portion 480a of the second barrier layer 480 is interposed between the first conductive plugs 430 and second conductive plugs 492. The bottom portion 480a creates additional interface between the first and second conductive plugs 430, 492, and therefore the performance and reliability may be decreased. Moreover, referring back to FIG. 18, while the etching back process or CMP process is carried out to remove the extra material deposited over the first dielectric layer 410, the top 430a of the first conductive plugs 430 is exposed to air, which contains oxygen, and an undesired oxide is formed on the top 430a. In order to ensure the conductivity of the first conductive plugs 430 and to avoid various issues in the subsequent processes, an additional etching process has to be performed to remove the undesired oxide on the top 430a before the formation of the second dielectric layer 440 as shown in FIG. 19.

According to various embodiments of the present disclosure, the shortfalls in the comparative example are resolved. Referring back to FIG. 14, the barrier layer 230 wraps sidewalls 210a, 220a of the first and second conductive structures 210, 220, and further covers the unoccupied portion 212a of the top 212 of the first conductive structure 210. It is noted that the barrier layer 230 is continuous from the sidewall 210a of the first conductive structure 210 through the unoccupied portion 212a of the top 212 to the sidewall 220a of the second conductive structure 220. Furthermore, there is no any barrier layer interposed between the first and second conductive structures 210, 220. Moreover, the first and second conductive structures 210, 220 are formed using a single deposition process. Accordingly, the embodiments of the present disclosure resolve all of the shortfalls in the comparative example.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims and their equivalents.

What is claimed is:

1. A method of forming a semiconductor structure, the method comprising:
   forming a first dielectric layer having a first through hole on a precursor substrate, the first through hole passing through the first dielectric layer;
   filling a sacrificial material in the first through hole;
   forming a second dielectric layer having a second through hole over the first dielectric layer, the second through hole exposing the sacrificial material in the first through hole, wherein the first and second dielectric layers are made of substantially the same material, the second dielectric layer is directly in contact with the first dielectric layer, and the second through hole has a bottom width less than a top width of the first through hole, and the first through hole is at least partially overlapped with the second through hole in a direction perpendicular to the precursor substrate;
   removing the sacrificial material after forming the second dielectric layer having the second through hole;
   forming a barrier layer lining sidewalls of the first and second through holes; and
   forming a conductive material in the first and second through holes.

2. The method according to claim 1, wherein the barrier layer continues from the sidewall of the first through hole to the sidewall of the second through hole.

3. The method according to claim 1, wherein the barrier layer has a substantially zigzag profile in a cross section along a height direction of the first and second through holes.

4. The method according to claim 1, wherein the precursor substrate comprises a memory array region and a peripheral circuit region adjacent thereto, and the first and second through holes and the sacrificial material are formed in the peripheral circuit region.

5. The method according to claim 1, wherein forming the second dielectric layer having the second through hole over the first dielectric layer comprises:
   depositing a dielectric material layer in a blanket manner over the first dielectric layer and the sacrificial material; and
   selectively etching the dielectric material layer to form the second through hole.

6. The method according to claim 5, after depositing the dielectric material layer, but prior to selectively etching the dielectric material layer to form the second through hole, further comprising removing portions of the first dielectric layer and the dielectric material layer to expose the memory array region.

7. The method according to claim 6, after removing portions of the first dielectric layer and the dielectric material layer, further comprising forming a stack comprising a plurality of conductive layers and a plurality of insulating layers on the memory array region, wherein the conductive layers and the insulating layers are alternately stacked.

8. The method according to claim 7, wherein forming the stack comprises forming a plurality of conductive wirings, and each conductive wiring is connected to a corresponding one of the conductive layers, and each conductive wiring has a longitudinal direction substantially perpendicular to a principal surface of the memory array region.

9. The method according to claim 7, after forming the stack, further comprising forming a plurality of data storage structures in the stack, wherein each data storage structure has a longitudinal direction substantially perpendicular to a principal surface of the memory array region.

10. The method according to claim 9, after forming the plurality of the data storage structures, further comprising forming an interlayered dielectric layer over the data storage structures and the dielectric material layer on the peripheral circuit region.

11. The method according to claim 10, wherein selectively etching the dielectric material layer to form the second through hole comprises selectively etching the interlayered dielectric layer to form a first contact hole exposing one of the data storage structures and a second contact hole communicating with the second through hole.

* * * * *